US010791260B2

(12) United States Patent
Aoki et al.

(10) Patent No.: US 10,791,260 B2
(45) Date of Patent: Sep. 29, 2020

(54) IMAGING DEVICE, INFORMATION ACQUISITION METHOD, AND INFORMATION ACQUISITION PROGRAM

(71) Applicant: FUJIFILM Corporation, Tokyo (JP)

(72) Inventors: Takashi Aoki, Saitama (JP); Yoichi Iwasaki, Saitama (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 16/832,075

(22) Filed: Mar. 27, 2020

(65) Prior Publication Data

US 2020/0228722 A1 Jul. 16, 2020

Related U.S. Application Data

(63) Continuation of application No. PCT/JP2018/035258, filed on Sep. 25, 2018.

(30) Foreign Application Priority Data

Sep. 28, 2017 (JP) .................................. 2017-188867

(51) Int. Cl.
*H04N 5/232* (2006.01)
*H04N 5/225* (2006.01)
(Continued)

(52) U.S. Cl.
CPC ......... *H04N 5/232122* (2018.08); *G02B 7/34* (2013.01); *G03B 17/14* (2013.01);
(Continued)

(58) Field of Classification Search
CPC .......... H04N 5/232122; H04N 5/2253; H04N 5/2254; H04N 5/23245; G02B 7/34; G03B 17/14
(Continued)

(56) References Cited

U.S. PATENT DOCUMENTS

2006/0257413 A1* 11/2006 Zlotnick .............. A61K 47/543
424/184.1
2009/0153693 A1* 6/2009 Onuki .................... H04N 9/045
348/222.1
(Continued)

FOREIGN PATENT DOCUMENTS

JP 2005-351925 A 12/2005
JP 2006-251033 A 9/2006
(Continued)

OTHER PUBLICATIONS

International Search Report for PCT/JP2018/035258 dated Dec. 25, 2018.
(Continued)

*Primary Examiner* — Pritham D Prabhakher
(74) *Attorney, Agent, or Firm* — Birch, Stewart, Kolasch & Birch, LLP

(57) ABSTRACT

There are provided an imaging device, an information acquisition method, and an information acquisition program that can simply and accurately acquire information related to a ray angle with respect to an image sensor in a case where subject light is incident on the image sensor through an interchangeable lens even though the interchangeable lens having no compatibility is mounted on the imaging device. An image sensor (201) including first phase difference pixels and second phase difference pixels is moved between a first position (P1) and a second position (P2) in the direction of an optical axis of an interchangeable lens. Information related to a ray angle with respect to the image sensor (201) in a case where subject light is incident on the image sensor (201) through the interchangeable lens is acquired on the basis of the outputs of the first and second phase difference pixels in a case where the image sensor (201) is moved to the first position (P1) and the outputs of the first and second phase difference pixels in a case where the image sensor (201) is moved to the second position (P2).

22 Claims, 17 Drawing Sheets

(51) Int. Cl.
G02B 7/34 (2006.01)
G03B 17/14 (2006.01)
(52) U.S. Cl.
CPC ......... H04N 5/2253 (2013.01); H04N 5/2254 (2013.01); H04N 5/23245 (2013.01)
(58) Field of Classification Search
USPC ....................................................... 348/349
See application file for complete search history.

(56) References Cited

U.S. PATENT DOCUMENTS

| | | | | |
|---|---|---|---|---|
| 2010/0302433 | A1* | 12/2010 | Egawa | H04N 9/045 348/345 |
| 2011/0058070 | A1* | 3/2011 | Awazu | H04N 5/23229 348/241 |
| 2012/0257882 | A1 | 10/2012 | Kikuchi | |
| 2013/0235253 | A1* | 9/2013 | Onuki | H04N 5/3696 348/349 |
| 2014/0267865 | A1* | 9/2014 | Kishi | H04N 5/23212 348/310 |
| 2015/0195446 | A1 | 7/2015 | Saito et al. | |
| 2015/0304547 | A1* | 10/2015 | Inoue | G02B 7/36 348/349 |
| 2016/0014327 | A1* | 1/2016 | Iwasaki | G02B 7/28 348/349 |
| 2016/0088245 | A1* | 3/2016 | Nakata | H01L 27/14605 250/201.2 |
| 2016/0182794 | A1 | 6/2016 | Aoki et al. | |
| 2016/0191824 | A1* | 6/2016 | Izawa | G03B 13/36 348/251 |
| 2016/0198105 | A1* | 7/2016 | Kawai | G03B 13/36 348/251 |
| 2017/0004603 | A1* | 1/2017 | Irie | H04N 5/23229 |
| 2019/0068869 | A1* | 2/2019 | Kadambala | H04N 5/23212 |

FOREIGN PATENT DOCUMENTS

| | | |
|---|---|---|
| JP | 2006-259055 A | 9/2006 |
| JP | 2012-222602 A | 11/2012 |
| JP | 2015-129846 A | 7/2015 |
| JP | 2016-143951 A | 8/2016 |
| WO | WO 2015/045829 A1 | 4/2015 |

OTHER PUBLICATIONS

Written Opinion of the International Searching Authority for PCT/JP2018/035258 dated Dec. 25, 2018.

* cited by examiner

IMAGING DEVICE, INFORMATION ACQUISITION METHOD, AND INFORMATION ACQUISITION PROGRAM

CROSS-REFERENCE TO RELATED APPLICATIONS

The present application is a Continuation of PCT International Application No. PCT/JP2018/035258 filed on Sep. 25, 2018 claiming priority under 35 U.S.C § 119(a) to Japanese Patent Application No. 2017-188867 filed on Sep. 28, 2017. Each of the above applications is hereby expressly incorporated by reference, in its entirety, into the present application.

BACKGROUND OF THE INVENTION

1. Field of the Invention

The present invention relates to an imaging device, an information acquisition method, and an information acquisition program, and more particularly, to a technique that acquires information about an interchangeable lens mounted on an imaging device.

2. Description of the Related Art

Roughly two types of interchangeable lenses can be mounted on an imaging device (camera) using an interchangeable lens.

One interchangeable lens is an interchangeable lens that is manufactured according to the communication standards of a camera body and can communicate with the camera body. In a case where this kind of interchangeable lens is mounted on the camera body, the camera body can communicate with the mounted interchangeable lens and can completely acquire lens information about the interchangeable lens (for example, the stop value (F-Number) of a stop provided in the interchangeable lens, the position of a focus lens, the focal length of the interchangeable lens, and the like).

The other interchangeable lens is an interchangeable lens (an interchangeable lens having no compatibility) that is not manufactured according to the communication standards of a camera body and cannot completely communicate with the camera body, and corresponds to a third-party interchangeable lens or an old lens. A lens, of which communication protocol and the like are different from those of the camera body and partial lens information can be acquired by the camera body but at least an F-Number cannot be acquired, corresponds to the other interchangeable lens having no compatibility in this example.

An imaging device disclosed in WO2015/045829A comprises an image sensor of which one pixel is divided into a plurality of areas and which includes an on-chip microlens causing a pupil image of an imaging optical system to be formed in a plurality of areas and reading units reading photoelectrically converted signals and provided in the plurality of divided areas. In a case where information about a stop value cannot be acquired from an interchangeable lens, the imaging device detects the current stop value of the interchangeable lens on the basis of the signals of the plurality of divided areas.

That is, since subject light is incident on only the divided areas corresponding to the stop value of the interchangeable lens among the plurality of divided areas forming one pixel of the image sensor, the current stop value of the interchangeable lens can be detected using the signals of the plurality of divided areas.

In a case where information about a stop value cannot be acquired from an interchangeable lens, an imaging device disclosed in JP2016-143951A takes a flash emission image and a flash non-emission image and estimates a stop value at the time of imaging on the basis of shutter speeds and subject distances at the time of taking of the flash emission image and the flash non-emission image and the guide number of flash light and the amount of reaching flash light at the time of taking of the flash emission image.

A camera disclosed in JP2006-259055A comprises an internal illuminometer that measures the illuminance of first light passing through an interchangeable lens and an external illuminometer that measures the illuminance of second light not passing through the interchangeable lens, and estimates the stop value of the interchangeable lens on the basis of the illuminance of the first light and the illuminance of second light that are detected by these illuminometers.

SUMMARY OF THE INVENTION

A special image sensor needs to be provided in the invention disclosed in WO2015/045829A to estimate a stop value. That is, the image sensor, of which one pixel is divided into a plurality of areas and which includes an on-chip microlens causing a pupil image of an imaging optical system to be formed in a plurality of areas and reading units reading photoelectrically converted signals and provided in the plurality of divided areas, needs to be provided in the invention disclosed in WO2015/045829A.

In the invention disclosed in JP2016-143951A, a flash emission image and a flash non-emission image need to be taken and lens information particularly cannot be acquired from an interchangeable lens having no compatibility. Accordingly, special means for acquiring a subject distance needs to be provided in the invention disclosed in JP2016-143951A. JP2016-143951A discloses that a subject distance is estimated from the size of a subject on the image sensor in a case where the size of the subject is known (for example, the size of the face of a person). However, the focal length of the interchangeable lens is necessary even in this case and a subject distance cannot be estimated in a case where a subject having a known size is not present in an imaging region.

The camera disclosed in JP2006-259055A needs to be provided with an internal illuminometer that measures the illuminance of first light passing through the interchangeable lens and an external illuminometer that measures the illuminance of external light not passing through the interchangeable lens, and needs to be provided with special means (external illuminometer) for acquiring an F-Number as in the invention disclosed in JP2016-143951A.

The invention has been made in consideration of the above-mentioned circumstances, and an object of the invention is to provide an imaging device, an information acquisition method, and an information acquisition program that can simply and accurately acquire information related to a ray angle with respect to an image sensor in a case where subject light is incident on the image sensor through an interchangeable lens even though the interchangeable lens having no compatibility is mounted on the imaging device.

To achieve the object, an imaging device according to an aspect of the invention comprises: an image sensor that includes a first phase difference pixel and a second phase difference pixel having incidence angle characteristics different from incidence angle characteristics of the first phase difference pixel; a mount part to and from which an interchangeable lens is attachable and detachable; a sensor driver (sensor drive section) that moves the image sensor in a direction of an optical axis of the interchangeable lens mounted on the mount part and moves the image sensor to a first position and a second position; a phase difference pixel information-acquisition section that acquires outputs of the first and second phase difference pixels of the image sensor in a case where the image sensor is moved to the first position by the sensor driver and acquires outputs of the first and second phase difference pixels of the image sensor in a case where the image sensor is moved to the second position; and an information acquisition section that acquires information related to a ray angle with respect to the image sensor in a case where subject light is incident on the image sensor through the interchangeable lens on the basis of the outputs of the first and second phase difference pixels at the first and second positions.

According to the aspect of the invention, under focusing on the fact that phase shift distances on the image sensor detected by the first and second phase difference pixels vary depending on a ray angle with respect to the image sensor even though a defocus distance is constant, the image sensor is moved between the first and second positions in the direction of the optical axis of the interchangeable lens. Information related to a ray angle with respect to the image sensor in a case where subject light is incident on the image sensor through the interchangeable lens is acquired on the basis of the outputs of the first and second phase difference pixels in a case where the image sensor is moved to the first position and the outputs of the first and second phase difference pixels in a case where the image sensor is moved to the second position. Accordingly, it is possible to acquire information related to a ray angle with respect to image sensor by merely moving the image sensor including the phase difference pixels in the direction of the optical axis even in a case where the interchangeable lens having no compatibility is mounted on the imaging device.

In the imaging device according to the aspect of the invention, it is preferable that the sensor driver moves the image sensor to a position, to which the image sensor is moved from the first position by a defined distance in a direction toward a focusing position where a subject is in focus, as the second position from the first position. The reason for this is to satisfactorily acquire phase shift distances at the first and second positions on the basis of the outputs of the first and second phase difference pixels.

It is preferable that the imaging device according to the aspect of the invention further comprises a focal area information-acquisition section that acquires focal area information representing a focus adjustment area in an entire area of the image sensor. The reason for this is that phase shift distances cannot be accurately detected from a focus adjustment area having low contrast.

In the imaging device according to the aspect of the invention, it is preferable that the focal area information-acquisition section acquires a preset focus adjustment area, an area where a main subject is present, or an area having high contrast in the entire area of the image sensor, as the focal area information representing the focus adjustment area.

In the imaging device according to the aspect of the invention, it is preferable that the sensor driver moves the image sensor to a position to which the image sensor is moved from the first position by a defined distance in a direction toward a focusing position where a subject present in the focus adjustment area is in focus, as the second position, in a case where a position where a phase difference is capable of being detected on the basis of outputs of the first and second phase difference pixels corresponding to the acquired focus adjustment area is defined as the first position.

The reason for this is that a phase difference cannot be detected well at the second position in a case where the image sensor is moved from the first position where a phase difference can be detected in a direction opposite to the direction toward the focusing position where a subject is in focus.

In the imaging device according to the aspect of the invention, it is preferable that the information related to a ray angle with respect to the image sensor is a ray angle with respect to the image sensor, a stop value of the interchangeable lens, or a numerical aperture of the interchangeable lens.

In the imaging device according to the aspect of the invention, it is preferable that the information acquisition section includes a first phase shift distance-detection section that detects a first phase shift distance at the first position and a second phase shift distance at the second position on the basis of the outputs of the first and second phase difference pixels of the image sensor, a first arithmetic operation section that calculates a difference between the first phase shift distance at the first position and the second phase shift distance at the second position detected by the first phase shift distance-detection section, and a second arithmetic operation section that calculates a ray angle with respect to the image sensor on the basis of the calculated difference and a moving distance between the first and second positions where the image sensor is moved, and the information acquisition section acquires the ray angle calculated by the second arithmetic operation section as the information related to a ray angle with respect to the image sensor.

A ray angle with respect to the image sensor can be calculated from a difference between the first phase shift distance at the first position and the second phase shift distance at the second position and a moving distance between the first and second positions where the image sensor is moved.

In the imaging device according to the aspect of the invention, it is preferable that the second arithmetic operation section calculates an angle, which is smaller than the ray angle and is defined by the first and second phase shift distances on the basis of the calculated difference and the moving distance between the first and second positions where the image sensor is moved, and calculates the ray angle by multiplying the calculated angle and a correction coefficient together.

An angle, which is defined by the first and second phase shift distances calculated on the basis of the calculated difference and the moving distance of the image sensor, is an angle that reflects the incidence angle characteristics of the first and second phase difference pixels of the image sensor, and is an angle smaller than the ray angle. Accordingly, it is possible to obtain the ray angle by multiplying the calculated angle and a correction coefficient, which represents a relationship between the calculated angle and the ray angle, together.

In the imaging device according to the aspect of the invention, it is preferable that the information acquisition section further includes a conversion section that converts the ray angle calculated by the second arithmetic operation section into a stop value or a numerical aperture, and the information acquisition section acquires the stop value or the numerical aperture converted by the conversion section, as the information related to a ray angle with respect to the image sensor. The stop value, the numerical aperture, and the ray angle of the interchangeable lens are related to each other. Accordingly, in a case where the ray angle is obtained, the stop value and the numerical aperture can be converted from the ray angle.

It is preferable that the imaging device according to the aspect of the invention further comprises a storage unit in which a relationship between a difference between a first phase shift distance at the first position and a second phase shift distance at the second position and a stop value or a numerical aperture of the interchangeable lens is stored for each stop value or each numerical aperture of the interchangeable lens; the information acquisition section includes a first phase shift distance-detection section that detects the first phase shift distance at the first position and the second phase shift distance at the second position on the basis of the outputs of the first and second phase difference pixels of the image sensor, a first arithmetic operation section that calculates a difference between the first phase shift distance at the first position and the second phase shift distance at the second position detected by the first phase shift distance-detection section, and a reading section that reads a stop value or a numerical aperture corresponding to the difference from the storage unit on the basis of the difference calculated by the first arithmetic operation section; and the information acquisition section acquires the stop value or the numerical aperture, which is read by the reading section, as the information related to a ray angle with respect to the image sensor.

A relationship between a difference between a first phase shift distance at the first position and a second phase shift distance at the second position and a stop value or a numerical aperture of the interchangeable lens is constant in a case where the moving distance between the first and second positions has a constant defined value. Accordingly, a relationship between a difference between first and second phase shift distances and a stop value or a numerical aperture of the interchangeable lens is stored in the storage unit for each stop value or each numerical aperture of the interchangeable lens. Then, in a case where the current stop value or the current numerical aperture of the interchangeable lens is acquired, the image sensor is moved by a defined distance to calculate a difference between first and second phase shift distances. It is possible to acquire the current stop value or the current numerical aperture of the interchangeable lens by reading a stop value or a numerical aperture corresponding to the difference from the storage unit on the basis of the calculated difference.

In a case where the difference calculated by the first arithmetic operation section is not stored in the storage unit, a stop value or a numerical aperture corresponding to a difference, which is closest to the difference calculated by the first arithmetic operation section among differences stored in the storage unit, may be read and used as the current stop value or the current numerical aperture of the interchangeable lens or corresponding stop values or numerical apertures may be interpolated on the basis of the difference calculated by the first arithmetic operation section and front and rear differences (stored in the front and rear of the calculated difference) stored in the storage unit to obtain the current stop value or the current numerical aperture of the interchangeable lens.

It is preferable that the imaging device according to the aspect of the invention further comprises a communication unit that communicates with the interchangeable lens, and a control unit that causes the sensor driver, the phase difference pixel information-acquisition section, and the information acquisition section to operate in a case where the stop value of the interchangeable lens is not capable of being acquired from the mounted interchangeable lens through the communication unit. The reason for this is that a method of acquiring information about the interchangeable lens (a stop value or a numerical aperture of the interchangeable lens) by communication is convenient in a case where an interchangeable lens of the same company or an interchangeable lens having compatibility is used and information can be exchanged by communication between the interchangeable lens and an imaging device body. Accordingly, only in a case where a stop value or a numerical aperture of the interchangeable lens cannot be acquired from the mounted interchangeable lens through the communication unit, the sensor driver, the phase difference pixel information-acquisition section, and the information acquisition section are adapted to operate to acquire a stop value or a numerical aperture of the interchangeable lens.

It is preferable that the imaging device according to the aspect of the invention further comprises a photometric unit that calculates brightness of a subject using a stop value or a numerical aperture of the interchangeable lens acquired through the communication unit or a stop value or a numerical aperture of the interchangeable lens acquired by the information acquisition section. In a case where a stop value or a numerical aperture of the interchangeable lens is known, the brightness of a subject (not the luminance of an image but the brightness of a real subject) can be calculated on the basis of information about "a stop value or a stop value converted from a numerical aperture", "shutter speed", and "the luminance (brightness) of an image". Further, the brightness of a real subject is used for the recognition of a scene (the determination of whether a scene is an outdoor scene or an indoor scene, and the like), and can be used for automatic white balance adjustment and the like.

It is preferable that the imaging device according to the aspect of the invention further comprises a second phase shift distance-detection section that detects a phase shift distance on the basis of the outputs of the first and second phase difference pixels of the image sensor, a defocus distance-calculation section that calculates a defocus distance on the basis of the information related to a ray angle with respect to the image sensor and the phase shift distance, and a focus adjustment unit that moves the image sensor on the basis of the calculated defocus distance.

According to this, it is possible to perform phase-difference AF (Autofocus) without driving the interchangeable lens by moving the image sensor, and to perform phase-difference AF even in a case where, particularly, an interchangeable lens having no compatibility is mounted.

It is preferable that the imaging device according to the aspect of the invention further comprises a mode setting section that sets an information acquisition mode, and the sensor driver, the phase difference pixel information-acquisition section, and the information acquisition section operate in a case where an imaging instruction is input from an imaging instruction unit in a state where the information acquisition mode is set by the mode setting section.

In a case where the information acquisition mode is set, a user needs to image a subject to acquire information related to a ray angle with respect to the image sensor. Since the information acquisition mode is set, a user can image a subject (for example, a subject having high contrast, a subject not yet saturated, or the like) in consideration of imaging to acquire information related to a good ray angle.

In a case where the stop of an interchangeable lens having no compatibility is adjusted, the information acquisition mode is set by a user whenever the stop of an interchangeable lens having no compatibility is adjusted. However, in a case where an interchangeable lens having no compatibility is mounted, the information acquisition mode may be automatically set through the detection of the mounting of the interchangeable lens.

It is preferable that the imaging device according to the aspect of the invention further comprises an image acquisition unit that acquires image data through the image sensor in a case where an imaging command is input from an imaging instruction unit and a recording unit that creates an image file storing the acquired image data and records the image file in a recording medium, and the recording unit records the information related to a ray angle with respect to the image sensor, which is acquired by the information acquisition section, in a header of the image file.

In the imaging device according to the aspect of the invention, it is preferable that the sensor driver moves the image sensor to three or more positions including the first and second positions, the phase difference pixel information-acquisition section acquires outputs of the first and second phase difference pixels of the image sensor in a case where the image sensor is moved to each of the three or more positions, and the information acquisition section acquires information related to a ray angle with respect to the image sensor in a case where subject light is incident on the image sensor through the interchangeable lens on the basis of the outputs of the first and second phase difference pixels at each of the three or more positions. Accordingly, information related to a more accurate ray angle can be acquired.

Another aspect of the invention provides an information acquisition method for an imaging device comprising an image sensor that includes a first phase difference pixel and a second phase difference pixel provided thereon, the second phase difference pixel having incidence angle characteristics different from incidence angle characteristics of the first phase difference pixel. The information acquisition method comprises: a step of acquiring outputs of the first and second phase difference pixels from the image sensor in a case where the image sensor is positioned at a first position in a direction of an optical axis of an interchangeable lens mounted on the imaging device; a step of moving the image sensor from the first position to a second position in the direction of the optical axis of the interchangeable lens by a sensor driver; a step of acquiring outputs of the first and second phase difference pixels from the image sensor in a case where the image sensor is positioned at the second position; and a step of acquiring information related to a ray angle with respect to the image sensor in a case where subject light is incident on the image sensor through the interchangeable lens on the basis of the outputs of the first and second phase difference pixels at the first and second positions.

In the information acquisition method according to another aspect of the invention, it is preferable that, in the step of moving the image sensor, the image sensor is moved to a position, to which the image sensor is moved from the first position by a defined distance in a direction toward a focusing position where a subject is in focus, as the second position from the first position.

In the information acquisition method according to another aspect of the invention, it is preferable that the information related to a ray angle with respect to the image sensor is a ray angle with respect to the image sensor, a stop value of the interchangeable lens, or a numerical aperture of the interchangeable lens.

In the information acquisition method according to another aspect of the invention, it is preferable that the step of acquiring information related to a ray angle with respect to the image sensor includes a step of detecting a first phase shift distance at the first position and a second phase shift distance at the second position on the basis of the outputs of the first and second phase difference pixels of the image sensor, a step of calculating a difference between the detected first phase shift distance at the first position and the detected second phase shift distance at the second position, and a step of calculating a ray angle with respect to the image sensor on the basis of the calculated difference and a moving distance between the first and second positions where the image sensor is moved, and the calculated ray angle is acquired as the information related to a ray angle with respect to the image sensor in the step of acquiring information related to a ray angle with respect to the image sensor.

In the information acquisition method according to another aspect of the invention, it is preferable that the imaging device comprises a storage unit in which a relationship between a difference between a first phase shift distance at the first position and a second phase shift distance at the second position and a stop value or a numerical aperture of the interchangeable lens is stored for each stop value or each numerical aperture of the interchangeable lens, the step of acquiring information related to a ray angle with respect to the image sensor includes a step of detecting the first phase shift distance at the first position and the second phase shift distance at the second position on the basis of the outputs of the first and second phase difference pixels of the image sensor, a step of calculating a difference between the detected first phase shift distance at the first position and the detected second phase shift distance at the second position, and a step of reading a stop value or a numerical aperture corresponding to the difference from the storage unit on the basis of the calculated difference, and the read stop value or the read numerical aperture is acquired as the information related to a ray angle with respect to the image sensor in the step of acquiring information related to a ray angle with respect to the image sensor.

Still another aspect of the invention provides an information acquisition program applied to an imaging device comprising an image sensor that includes a first phase difference pixel and a second phase difference pixel provided thereon, the second phase difference pixel having incidence angle characteristics different from incidence angle characteristics of the first phase difference pixel. The information acquisition program causes the imaging device to implement: a function of acquiring outputs of the first and second phase difference pixels from the image sensor in a case where the image sensor is positioned at a first position in a direction of an optical axis of an interchangeable lens mounted on the imaging device; a function of moving the image sensor from the first position to a second position in the direction of the optical axis of the interchangeable lens by a sensor driver; a function of acquiring outputs of the first and second phase difference pixels from the image sensor in a case where the image sensor is positioned at the second position; and a function of acquiring information related to a ray angle with respect to the image sensor in a case where subject light is incident on the image sensor through the interchangeable lens on the basis of the outputs of the first and second phase difference pixels at the first and second positions.

According to the invention, it is possible to simply and accurately acquire information related to a ray angle with respect to an image sensor in a case where subject light is incident on the image sensor through an interchangeable lens even though the interchangeable lens having no compatibility is mounted on the imaging device.

BRIEF DESCRIPTION OF THE DRAWINGS

FIG. 18 is a diagram showing a relationship between an aperture diameter D, a radius r of the aperture diameter, a focal length f, and a ray angle θ of a lens, a first phase shift distance d1 at the first position P1, a second phase shift distance d2 at the second position P2, and the like.

DESCRIPTION OF THE PREFERRED EMBODIMENTS

Preferred embodiments of an imaging device, an information acquisition method, and an information acquisition program according to the invention will be described below with reference to accompanying drawings.

<Appearance of Imaging Device>

Figure 1:
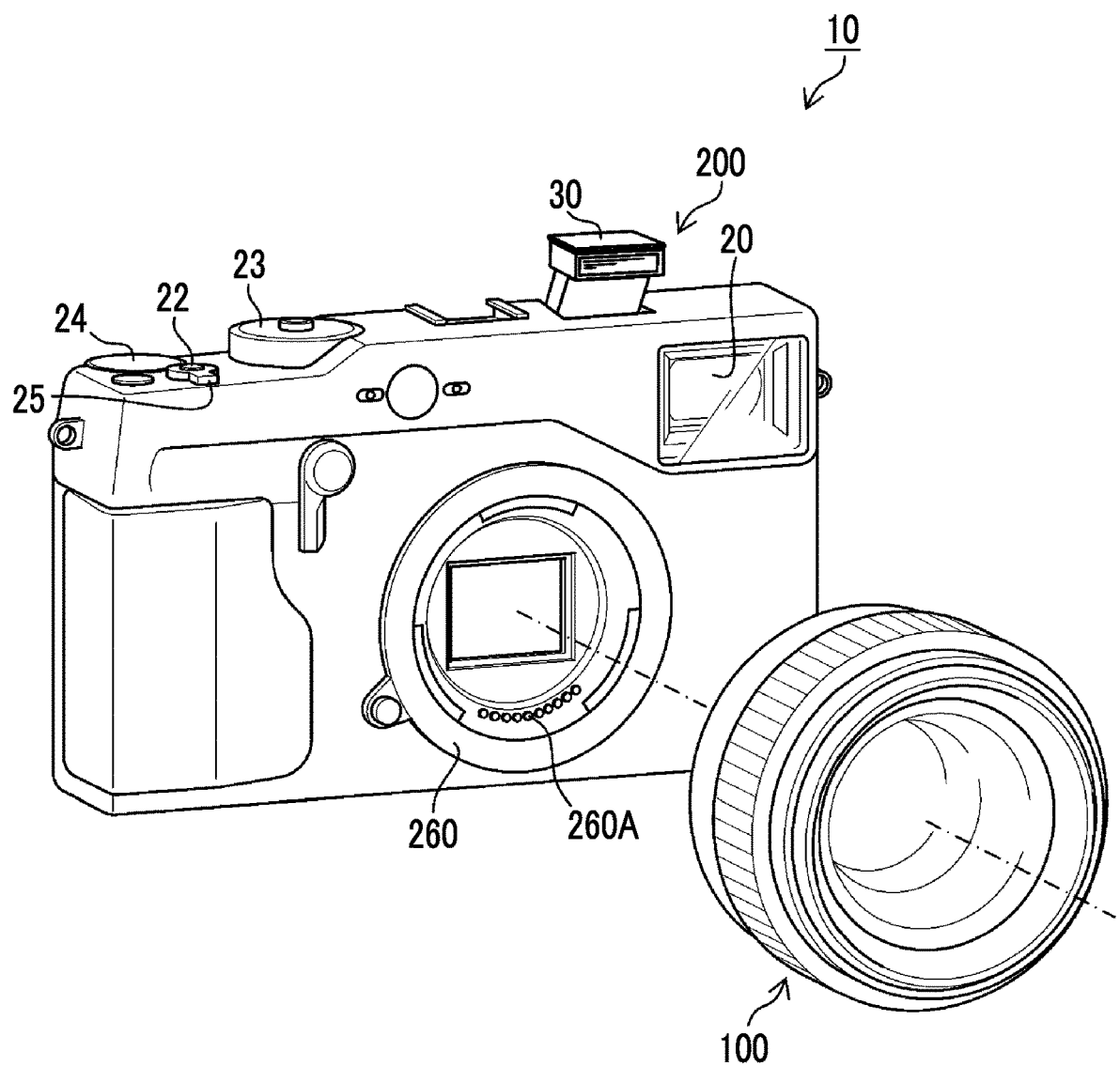
FIG. 1 is a perspective view of an imaging device according to the invention that is viewed obliquely from the front side.
Figure 2:
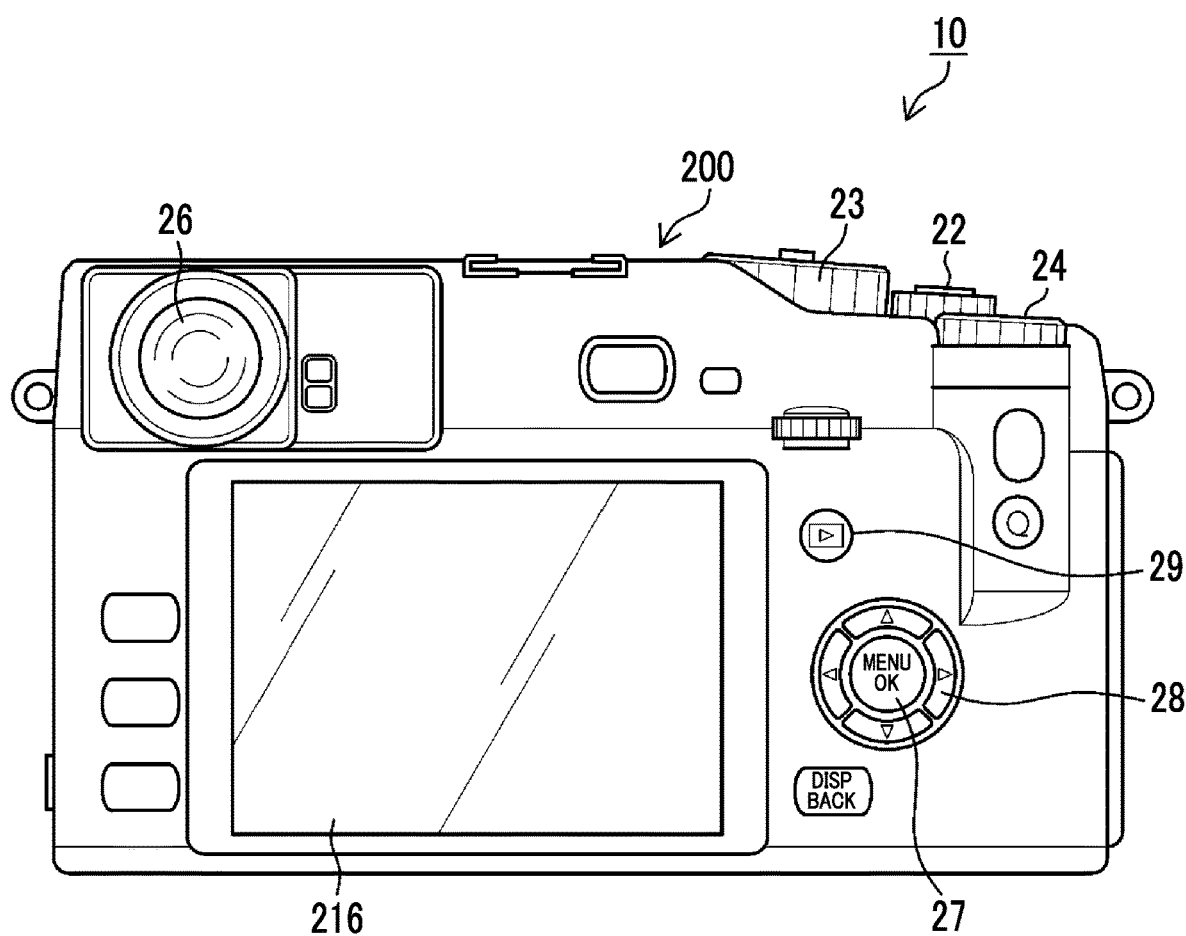
FIG. 2 is a back view of the imaging device.

FIG. 1 is a perspective view of an imaging device that is viewed obliquely from the front side, and FIG. 2 is a back view of the imaging device.

As shown in FIG. 1, an imaging device 10 is a mirrorless digital single-lens camera including an interchangeable lens 100 and a camera body 200 to and from which the interchangeable lens 100 is attachable and detachable.

In FIG. 1, a body mount 260 (mount part) to and from which the interchangeable lens 100 is attachable and detachable, a finder window 20 of an optical finder, and the like are provided on the front surface of the camera body 200, and a shutter release switch 22, a shutter speed dial 23, an exposure correction dial 24, a power lever 25, and a built-in flash 30 are mainly provided on the upper surface of the camera body 200.

As shown in FIG. 2, a monitor 216 formed of a liquid crystal display or the like, an eyepiece part 26 of the optical finder, a MENU/OK key 27, a cross key 28, a play button 29, and the like are mainly provided on the back surface of the camera body 200.

The monitor 216 functions as a display unit that displays various menu screens in addition to displaying a live view image in an imaging mode and playing back and displaying a taken image in a playback mode. The MENU/OK key 27 is an operation key having both a function as a menu button for giving a command to display a menu on the screen of the monitor 216 and a function as an OK button for giving a command to determine and perform selected contents and the like. The cross key 28 is an operation part that is used to input instructions in four directions of an upward direction, a downward direction, a left direction, and a right direction, and functions as a button that is used to select an item from the menu screen or is used to give an instruction to select various setting items from each menu. Further, an upper key and a lower key of the cross key 28 function as zoom switches at the time of imaging or play-zoom switches in the playback mode, and a left key and a right key thereof function as frame advance (fast-forward and rewind) buttons in the playback mode. Furthermore, the MENU/OK key 27, the cross key 28, and the menu screens displayed on the monitor 216 can be used to set various imaging modes including a continuous shooting mode where static images are to be continuously taken in addition to a normal imaging mode where a single static image is to be taken. A continuous shooting speed (for example, about 8 frames/sec, about 3 frames/sec) can be set in a case where the continuous shooting mode is set.

The play button 29 is a button that is used to switch a mode to the playback mode where the monitor 216 is caused to display taken and recorded static images or videos.

<Internal Configuration of Imaging Device>

[Interchangeable Lens]

<Interchangeable Lens Having No Compatibility>

Figure 3:
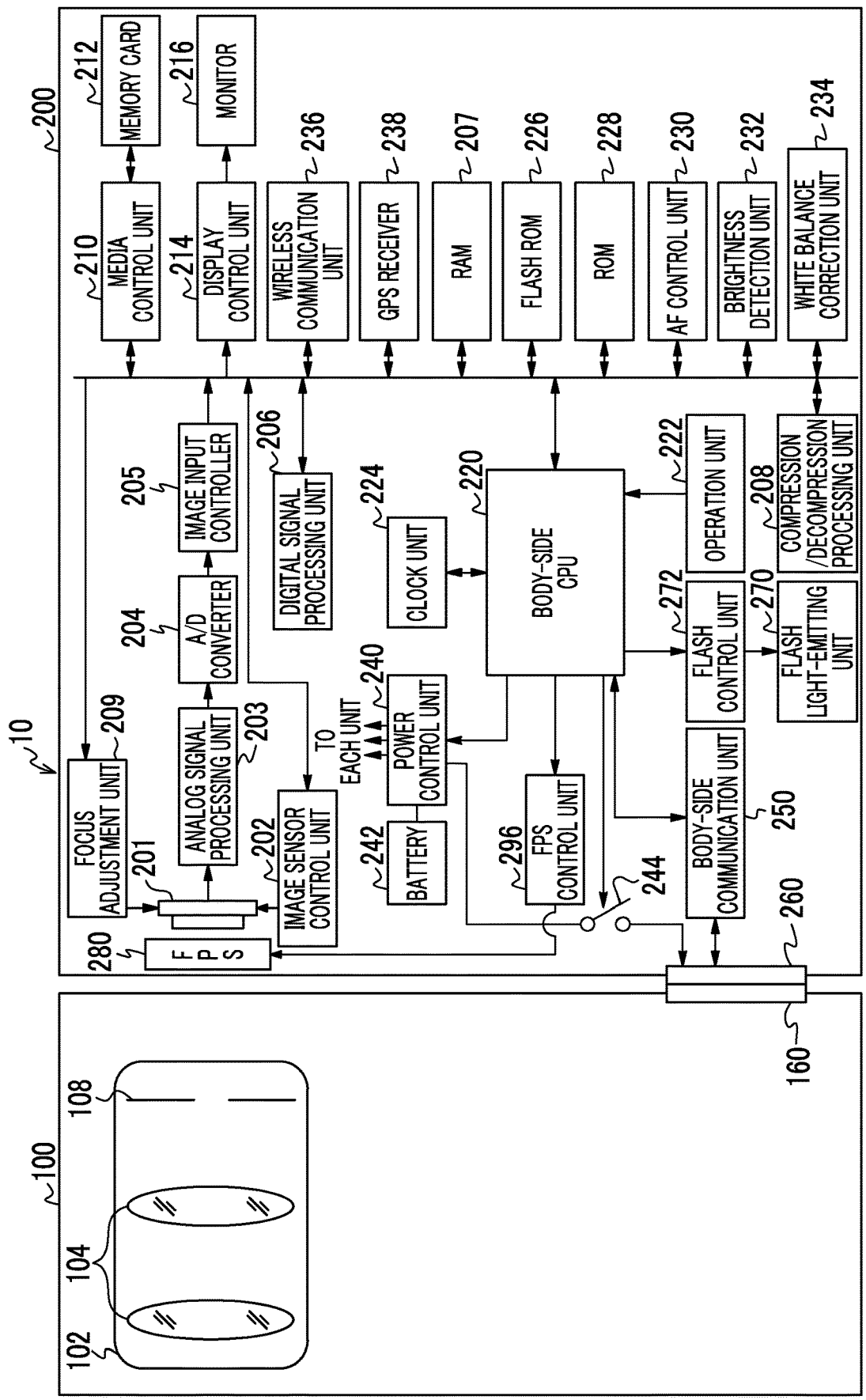
FIG. 3 is a block diagram showing an embodiment of the internal configuration of the imaging device, and is a diagram showing a state where an interchangeable lens having no compatibility is mounted.

FIG. 3 is a block diagram showing an embodiment of the internal configuration of the imaging device 10.

The interchangeable lens 100 shown in FIG. 3 is an interchangeable lens that comprises a lens mount 160 mountable on the body mount 260 of the camera body 200 but has no compatibility with the camera body 200. The interchangeable lens 100 also includes an interchangeable lens that can be mounted on the camera body 200 through a mount adapter (not shown).

An imaging optical system 102 of the interchangeable lens 100 includes a lens group 104 including a focus lens and a stop 108.

In a case where a focus ring (not shown) is manually operated, the focus lens of the lens group 104 can be moved in a range corresponding to a range from close to infinity.

In a case where a stop ring (not shown) is manually operated, the size of a stop aperture of the stop 108 can be changed from the maximum stop to the minimum stop one step or ⅓ step at a time or continuously. Accordingly, an F-Number can be set in a range from the maximum stop (for example, a stop value (F-Number) is F1.2) to the minimum stop (for example, an F-Number is F22).

<Interchangeable Lens Having Compatibility>

Figure 4:
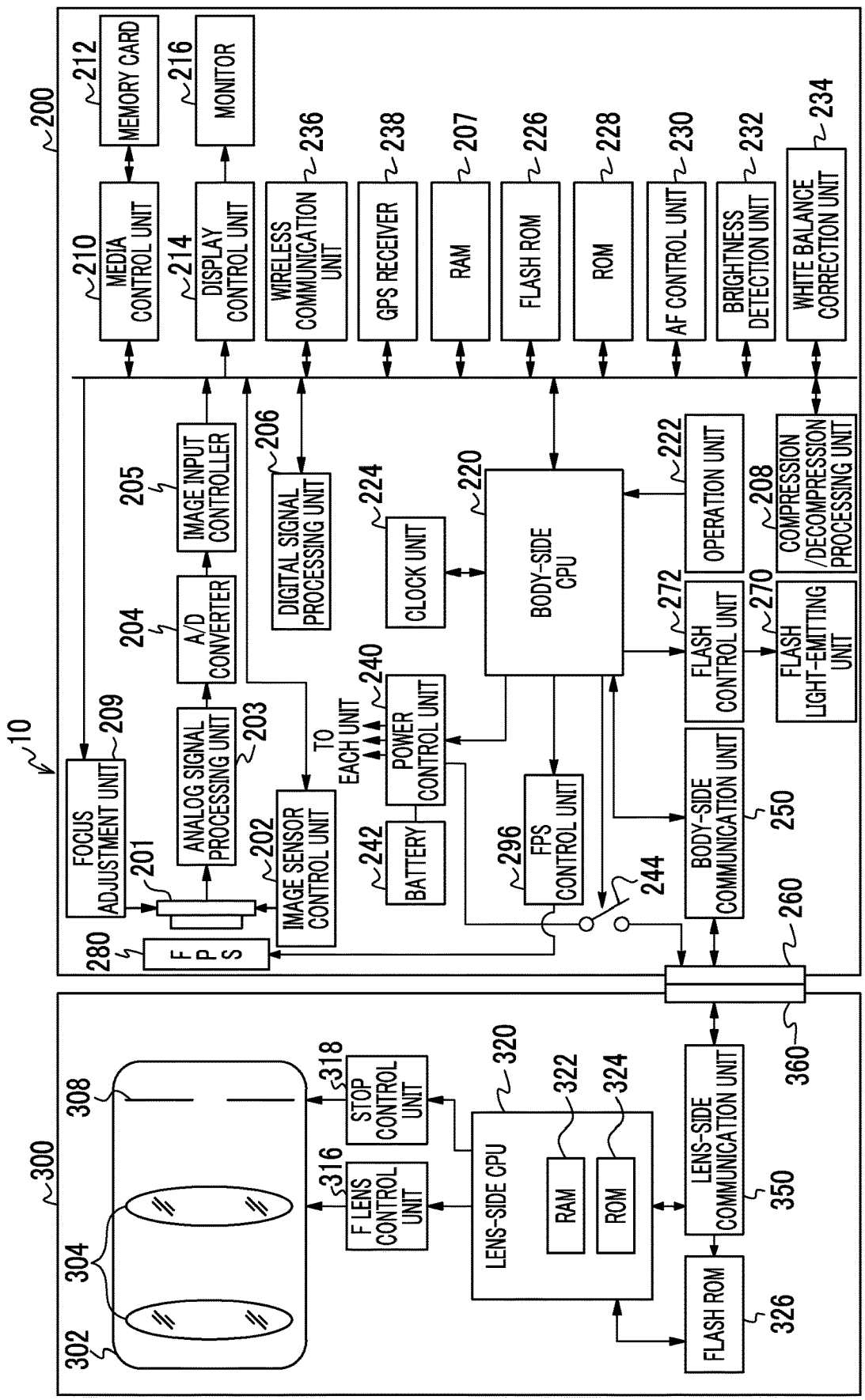
FIG. 4 is a block diagram showing an embodiment of the internal configuration of the imaging device, and is a diagram showing a state where an interchangeable lens having compatibility is mounted.

FIG. 4 is a block diagram showing a second embodiment of the internal configuration of the imaging device 10.

An interchangeable lens 300 shown in FIG. 4 is an interchangeable lens having compatibility that is manufactured according to the communication standards of the camera body 200 and can communicate with the camera body 200 as described later.

The interchangeable lens 300 comprises an imaging optical system 302, a focus lens control unit 316, a stop control unit 318, a lens-side central processing unit (CPU) 320, a flash read only memory (ROM) 326, a lens-side communication unit 350, and a lens mount 360.

The imaging optical system 302 of the interchangeable lens 300 includes a lens group 304 including a focus lens and a stop 308.

The focus lens control unit 316 controls the focus position of the focus lens according to a command from the lens-side CPU 320. The stop control unit 318 controls the stop 308 according to a command from the lens-side CPU 320.

The lens-side CPU 320 generally controls the interchangeable lens 300, and a ROM 324 and a random access memory (RAM) 322 are built in the lens-side CPU 320.

The flash ROM 326 is a non-volatile memory that stores a program and the like downloaded from the camera body 200.

The lens-side CPU 320 generally controls each part of the interchangeable lens 300 according to a control program stored in the ROM 324 or the flash ROM 326 while using the RAM 322 as a work area.

The lens-side communication unit 350 communicates with the camera body 200 through a plurality of signal terminals (lens-side signal terminals) provided on the lens mount 360 in a state where the lens mount 360 is mounted on the body mount 260 of the camera body 200. That is, the lens-side communication unit 350 transmits and receives a request signal and a response signal to and from (performs two-way communication with) a body-side communication unit 250 of the camera body 200, which is connected to the lens-side communication unit 350 through the lens mount 360 and the body mount 260, according to a command from the lens-side CPU 320; and notifies the lens information of the respective optical members of the imaging optical system 302 (the focus position information and focal length information of the focus lens, stop information, and the like) to the camera body 200.

Further, the interchangeable lens 300 comprises a detection unit (not shown) that detects the focus position information of the focus lens and stop information. Here, the stop information is information representing a stop value (F-Number) of the stop 308, the aperture diameter of the stop 308, and the like. In this example, an F-Number will be used as the stop information hereinafter.

It is preferable that the lens-side CPU 320 stores various kinds of lens information, which includes the detected focus position information and the detected stop information, in the RAM 322 to meet a request for lens information transmitted from the camera body 200. Further, the lens information is detected in a case where there is a request for the lens information transmitted from the camera body 200, is detected in a case where the optical member is driven, or is detected at regular intervals (an interval sufficiently shorter than the frame interval of a video); and detection results can be stored.

[Camera Body]

The camera body 200 of the imaging device 10 shown in FIG. 3 or 4 comprises an image sensor 201 (image acquisition unit), an image sensor control unit 202, an analog signal processing unit 203, an analog/digital (A/D) converter 204, an image input controller 205, a digital signal processing unit 206, a RAM 207, a compression/decompression processing unit 208, a focus adjustment unit 209, a media control unit 210 (recording unit), a memory card 212 (recording medium), a display control unit 214, a monitor 216, a body-side CPU 220, an operation unit 222, a clock unit 224, a flash ROM 226, a ROM 228, an AF control unit 230, a brightness detection unit 232 (photometric unit), a white balance correction unit 234, a wireless communication unit 236, a global positioning system (GPS) receiver 238, a power control unit 240, a battery 242, a body-side communication unit 250, a body mount 260, a flash light-emitting unit 270 and a flash control unit 272 of the built-in flash 30 (FIG. 1), a focal-plane shutter (FPS) 280, and an FPS control unit 296.

<Configuration of Image Sensor>

The image sensor 201 is formed of a complementary metal-oxide semiconductor (CMOS) color image sensor. The image sensor 201 is not limited to a CMOS color image sensor, and may be an XY address color image sensor or a charge coupled device (CCD) image sensor.

Figures 5, 6:
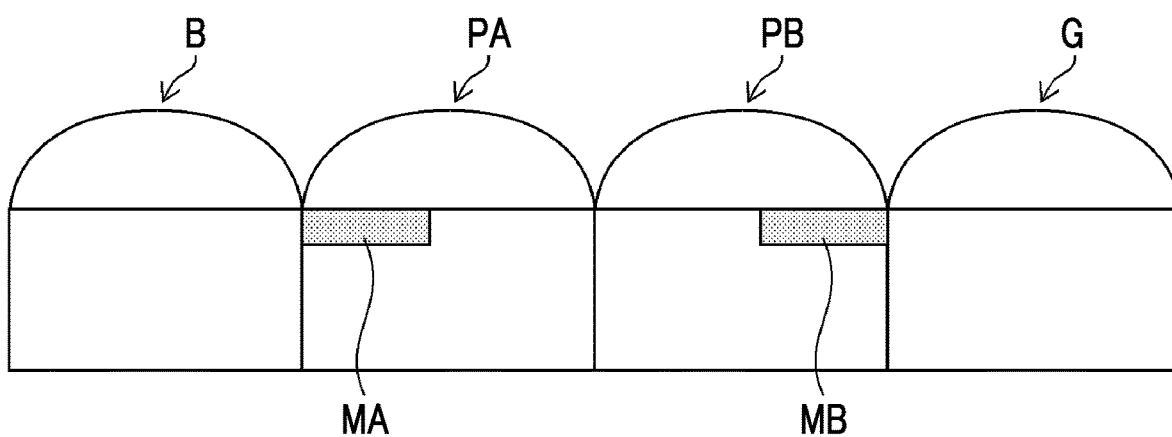
FIG. 5 is a diagram showing an example of the configuration of an image sensor.
FIG. 6 is a schematic diagram showing the cross section of a part of a phase difference pixel row of the image sensor.

In the image sensor 201, red (R) color filters, green (G) color filters, and blue (B) color filters are arranged in the form of a periodic color array (a general Bayer array in an example shown in FIG. 5) on a plurality of pixels formed of photoelectric conversion elements (photodiodes) two-dimensionally arrayed in an x direction (horizontal direction) and a y direction (vertical direction) as shown in FIG. 5, and a microlens is disposed on each photodiode.

Further, phase difference pixels (first phase difference pixels PA and second phase difference pixels PB) and normal pixels for imaging (pixels other than the phase difference pixels) are arranged in the image sensor 201.

In the image sensor 201 having a Bayer array, normal pixel rows in which only normal pixels are arranged in the horizontal direction (row direction) include RG rows in which pixels (R pixels) including R filters and which pixels (G pixels) including G filters are alternately arranged in the row direction and GB rows in which G pixels and pixels (B pixels) including B filters are alternately arranged in the row direction. Further, the RG rows and the GB rows are alternately arranged in the vertical direction (column direction).

Furthermore, the image sensor 201 includes a phase difference pixel row in which the first phase difference pixels PA and the second phase difference pixels PB are arranged and the normal pixel rows in which only normal pixels are arranged.

The phase difference pixel row of the image sensor 201 is formed so that three pixels, that is, a pair of first and second phase difference pixels PA and PB and one normal pixel are periodically arranged as one period in a specific GB row of the Bayer array in the row direction. Accordingly, in the phase difference pixel row, the G pixels and the B pixels are alternately arranged with two pixels (a pair of first and second phase difference pixels PA and PB) interposed therebetween in the row direction. The phase difference pixel row of this example is provided in the GB row of the Bayer array, but is not limited thereto. The phase difference pixel row may be provided in the RG row.

The periodic color array is not limited to the Bayer array, and may be other color filter arrays, such as an X-Trans (registered trademark) array.

FIG. 6 is a schematic diagram showing the cross section of a part of the phase difference pixel row of the image sensor 201. FIG. 6 shows four pixels, that is, a pair of first and second phase difference pixels PA and PB and a B pixel and a G pixel which are normal pixels adjacent to the pair of first and second phase difference pixels PA and PB. The first and second phase difference pixels PA and PB are provided with light blocking films MA and MB that limit incidence light, respectively.

Figure 7:
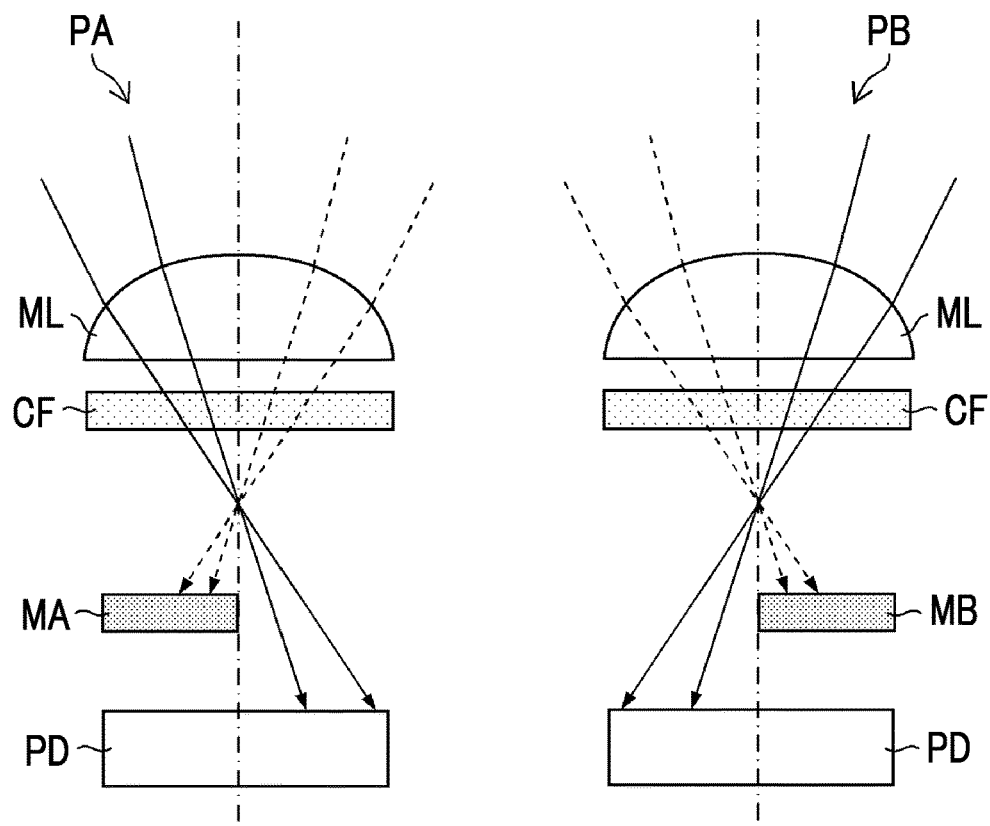
FIG. 7 is an enlarged view of main parts showing the configuration of a first phase difference pixel PA and a second phase difference pixel PB.

FIG. 7 is an enlarged view of main parts showing the configuration of the first and second phase difference pixels PA and PB.

As shown in FIG. 7, the light blocking film MA is provided on the front surface side (microlens ML side) of the photodiode PD of the first phase difference pixel PA and the light blocking film MB is provided on the front surface side of the photodiode PD of the second phase difference pixel PB. The microlenses ML and the light blocking films MA and MB have a pupil dividing function, and the light blocking film MA blocks light on the left half of the light-receiving surface of the photodiode PD in FIG. 7. For this reason, only luminous flux, which passes through the left side of an optical axis, of luminous flux passing through the exit pupil of the imaging optical system 102 is selectively received by the first phase difference pixel PA. Further, a G filter is disposed below the microlens ML as a color filter CF.

On the other hand, the light blocking film MB blocks light on the right half of the light-receiving surface of the photodiode PD of the second phase difference pixel PB. For this reason, only luminous flux, which passes through the right side of an optical axis, of luminous flux passing through the exit pupil of the imaging optical system 102 is selectively received by the second phase difference pixel PB. The luminous flux passing through the exit pupil is divided into left and right pieces in this way by the microlenses ML and the light blocking films MA and MB having a pupil dividing function, and is incident on the first and second phase difference pixels PA and PB, respectively.

Figure 8:
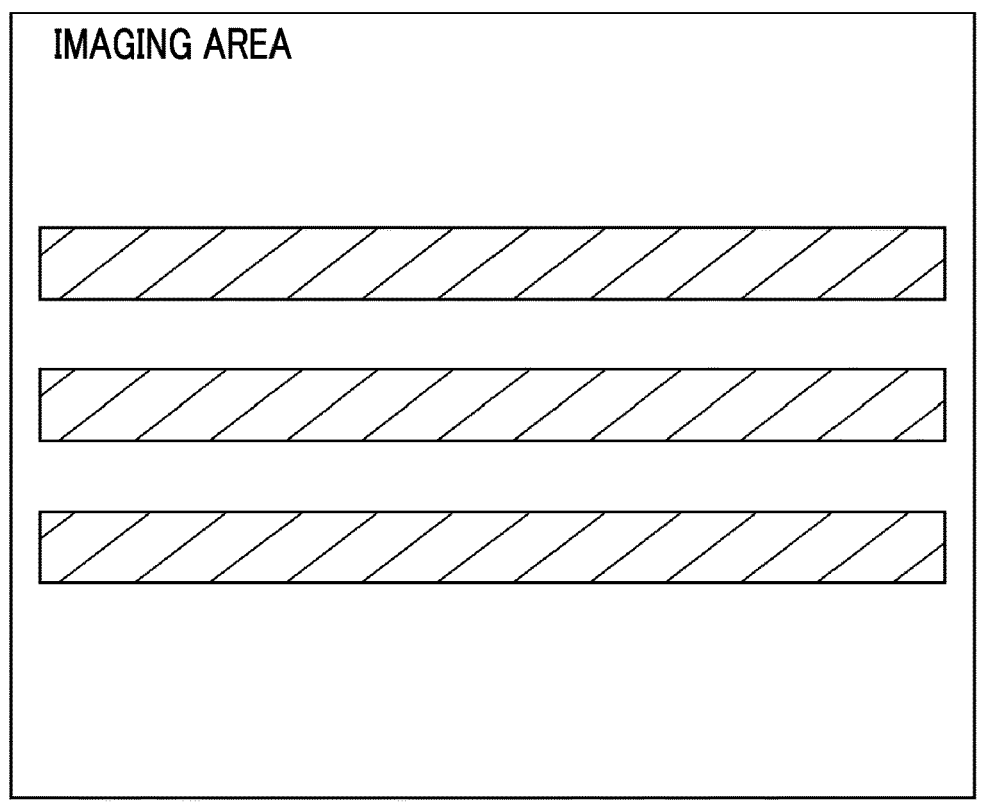
FIG. 8 is a diagram showing an example of an area, in which the first phase difference pixels PA and the second phase difference pixels PB are arranged, of the imaging area of the image sensor.
Figure 9:
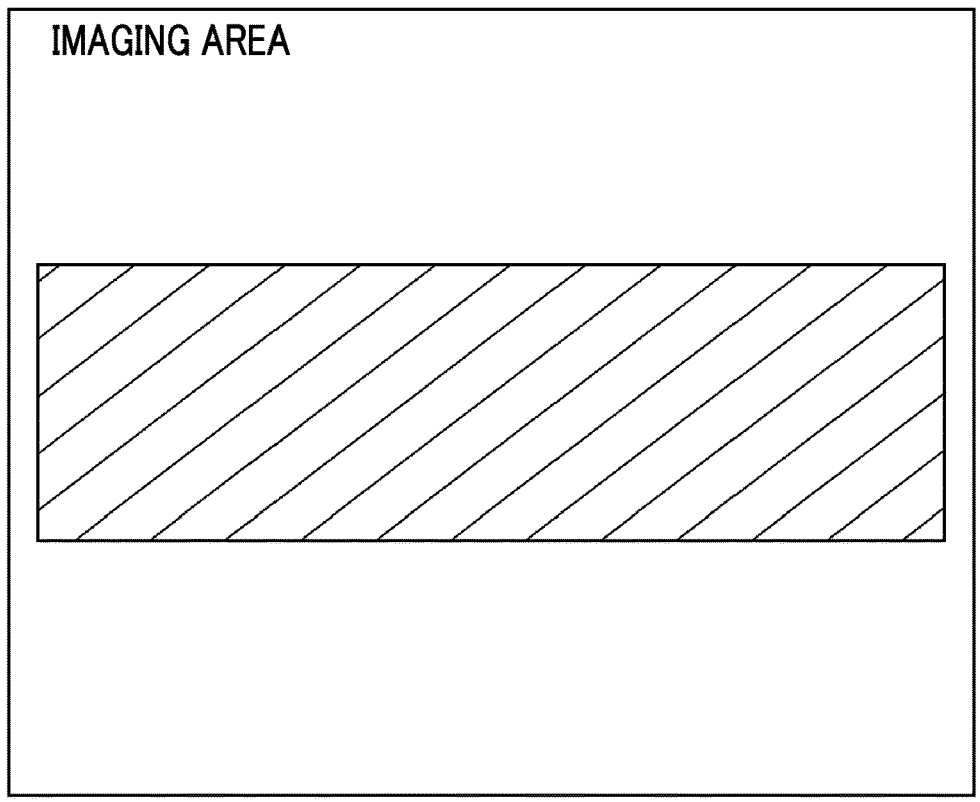
FIG. 9 is a diagram showing another example of the area, in which the first phase difference pixels and the second phase difference pixels are arranged, of the imaging area of the image sensor.
Figure 10:
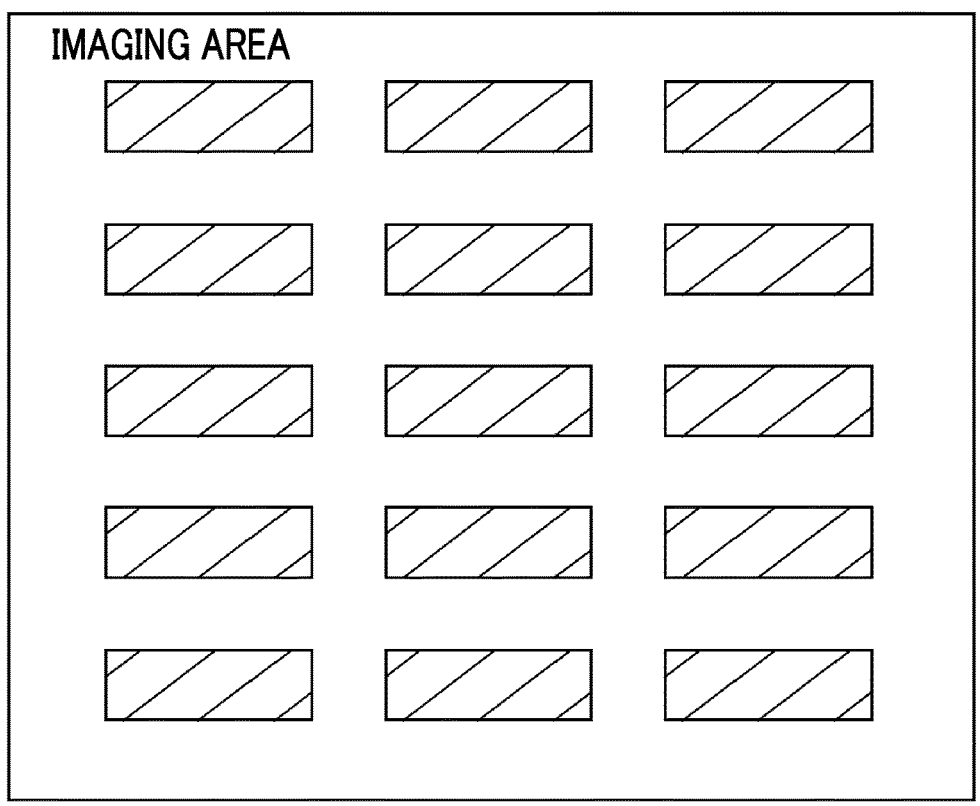
FIG. 10 is a diagram showing a still another example of the area, in which the first phase difference pixels PA and the second phase differences pixel PB are arranged, of the imaging area of the image sensor.

FIGS. 8 to 10 show examples of an area, in which the first and second phase difference pixels PA and PB are arranged, of the imaging area of the image sensor 201. In FIGS. 8 to 10, the area in which the first and second phase difference pixels PA and PB are arranged is shown by hatching.

Returning to FIG. 3, the image sensor 201 of this example is provided to be movable in the direction of the optical axis and the position of the image sensor 201 can be adjusted by the focus adjustment unit 209. Accordingly, in a case where the position of the image sensor 201 in the direction of the optical axis is controlled, a subject image can be caused to focus on the image forming surface of the image sensor 201.

The optical image of a subject, which is formed on the light-receiving surface of the image sensor 201 by the imaging optical system 102 of the interchangeable lens 100, is converted into electrical signals by the image sensor 201. Electric charges corresponding to the amount of light to be incident are accumulated in each pixel of the image sensor 201, and an electrical signal corresponding to the amount of electric charges accumulated in each pixel is read from the image sensor 201 as an image signal.

The image sensor control unit 202 controls the reading of the image signals from the image sensor 201 according to the command of the body-side CPU 220. Further, the image sensor control unit 202 has a function as an electronic shutter that simultaneously discharges (simultaneously resets) the electric charges accumulated in the respective pixels of the image sensor 201 to start exposure according to an electronic shutter control signal from the body-side CPU 220.

The analog signal processing unit 203 performs various kinds of analog signal processing on analog image signals that are obtained from the imaging of a subject performed by the imaging sensor 201. The analog signal processing unit 203 includes a sampling hold circuit, a color separation circuit, an automatic gain control (AGC) circuit, and the like. The AGC circuit functions as a sensitivity adjuster adjusting sensitivity (ISO sensitivity (ISO: International Organization for Standardization)) at the time of imaging, and adjusts the gain of an amplifier amplifying an image signal to be input to make the signal level of the image signal be in an appropriate range. The A/D converter 204 converts an analog image signal, which is output from the analog signal processing unit 203, into a digital image signal.

Image data (mosaic image data) for each of the RGB pixels, which are output through the image sensor 201, the analog signal processing unit 203, and the A/D converter 204 at the time of taking of a static image or a video, are input to the RAM 207 from the image input controller 205, and are temporarily stored in the RAM 207. In a case where the image sensor 201 is a CMOS image sensor, the analog signal processing unit 203 and the A/D converter 204 are often built in the imaging sensor 201.

The digital signal processing unit 206 performs various kinds of digital signal processing on the image data stored in the RAM 207. The digital signal processing unit 206 appropriately reads the image data stored in the RAM 207; performs digital signal processing, such as offset processing, gain-control processing including sensitivity correction, gamma correction processing, demosaic processing (also referred to as demosaicing processing or demosaicing), and RGB/YCrCb conversion processing, on the read image data; and stores the image data, which have been subjected to the digital signal processing, in the RAM 207 again. The demosaic processing is processing for calculating color information about all RGB colors for each pixel from a mosaic image including RGB colors in the case of an image sensor including, for example, color filters having the three RGB colors, and generates image data of three RGB surfaces, which have been subjected to demosaicing, from mosaic data (point-sequence RGB data).

The RGB/YCrCb conversion processing is processing for converting the RGB data, which have been subjected to demosaicing, into luminance data (Y) and color difference data (Cr and Cb).

The compression/decompression processing unit 208 performs compression processing on the luminance data Y and the color difference data Cb and Cr, which are temporarily stored in the RAM 207 and are not compressed, at the time of recording of a static image or a video. The compression/decompression processing unit 208 compresses a static image in, for example, joint photographic coding experts group (JPEG) format and compresses a video in, for example, H.264 format. Image data, which are compressed by the compression/decompression processing unit 208, are recorded in the memory card 212 through the media control unit 210. Further, the compression/decompression processing unit 208 performs decompression processing on the compressed image data that are obtained from the memory card 212 through the media control unit 210 in the playback mode, and generates uncompressed image data.

The media control unit 210 performs control to record the image data, which are compressed by the compression/decompression processing unit 208, in the memory card 212. Further, the media control unit 210 performs control to read the compressed image data from the memory card 212.

The display control unit 214 performs control to cause the monitor 216 to display the uncompressed image data that are stored in the RAM 207. The monitor 216 is formed of, for example, a display device, such as a liquid crystal display device or an organic electroluminescence display device.

In a case where the monitor 216 is to be caused to display a live view image, digital image signals continuously generated by the digital signal processing unit 206 are temporarily stored in the RAM 207. The display control unit 214 converts the digital image signals temporarily stored in the RAM 207 into a signal format for display, and sequentially outputs the converted digital image signals to the monitor 216. Accordingly, since a taken image is displayed on the monitor 216 in real time, the monitor 216 can be used as an electronic view finder.

The shutter release switch 22 is an imaging instruction unit that is used to input an imaging instruction, and is formed of a two-stage stroke switch that has a so-called "half press" stroke and a so-called "full press" stroke.

In an imaging mode for a static image, the shutter release switch 22 is half pressed to output an S1-on signal and the shutter release switch 22 is further pressed from the half-pressed state and is fully pressed to output an S2-on signal. In a case where an S1-on signal is output, the body-side CPU 220 performs imaging preparation processing, such as auto-focus (AF) control and auto exposure (AE) control. In a case where an S2-on signal is output, the body-side CPU 220 performs imaging processing and recording processing for a static image. It goes without saying that AF control and AE control are automatically performed in a case where an auto mode is set by the operation unit 222 and AF control and AE control are not performed in a case where a manual mode is set.

Further, in a case where the shutter release switch 22 is fully pressed to output an S2-on signal in an imaging mode for a video, the camera body 200 is made to be in a video recording mode where the recording of a video is to be started and performs image processing and recording processing for a video. Then, in a case where the shutter release switch 22 is fully pressed again to output an S2-on signal, the camera body 200 is made to be in a standby state and temporarily stops the recording processing for a video.

The shutter release switch 22 is not limited to the form of a two-stage stroke switch that has a "half press" stroke and a "full press" stroke. The shutter release switch 22 may output an S1-on signal and an S2-on signal by a single operation, or individual switches may be provided to output an S1-on signal and an S2-on signal, respectively.

Furthermore, in a form where an operation instruction is to be given by a touch panel or the like, an area corresponding to an operation instruction displayed on the screen of the touch panel may be touched as operation means to output the operation instruction. As long as an instruction to perform the imaging preparation processing or the imaging processing is given, the form of the operation means is not limited thereto.

A static image or a video, which is obtained from imaging, is compressed by the compression/decompression processing unit 208; compressed image data are converted into an image file having a header to which required additional information, such as the date and time of imaging, GPS information, and imaging conditions (an F-Number, a shutter speed, ISO sensitivity, and the like), are added; and the image file is then stored in the memory card 212 through the media control unit 210.

The body-side CPU 220 generally controls the operation of the entire camera body 200, the driving of the optical members of the interchangeable lens 100, and the like and controls the respective parts of the camera body 200 and the interchangeable lens 300 on the basis of inputs from the operation unit 222, which includes the shutter release switch 22, and the like.

The clock unit 224 functions as a timer and measures time on the basis of a command from the body-side CPU 220. Further, the clock unit 224 functions as a calendar and measures the current date and time.

The flash ROM 226 is a non-volatile memory where data can be read and written, and stores setting information.

A camera control program to be executed by the body-side CPU 220, information about the defects of the image sensor 201, and various parameters and tables used for image processing and the like are stored in the ROM 228. The body-side CPU 220 controls the respective parts of the camera body 200 and the interchangeable lens 300 according to the camera control program stored in the ROM 228 while using the RAM 207 as a work area.

The AF control unit 230 calculates a defocus distance required for the control of phase-difference AF, and controls the position of the image sensor 201 through the focus adjustment unit 209 on the basis of the calculated defocus distance.

Figure 11:
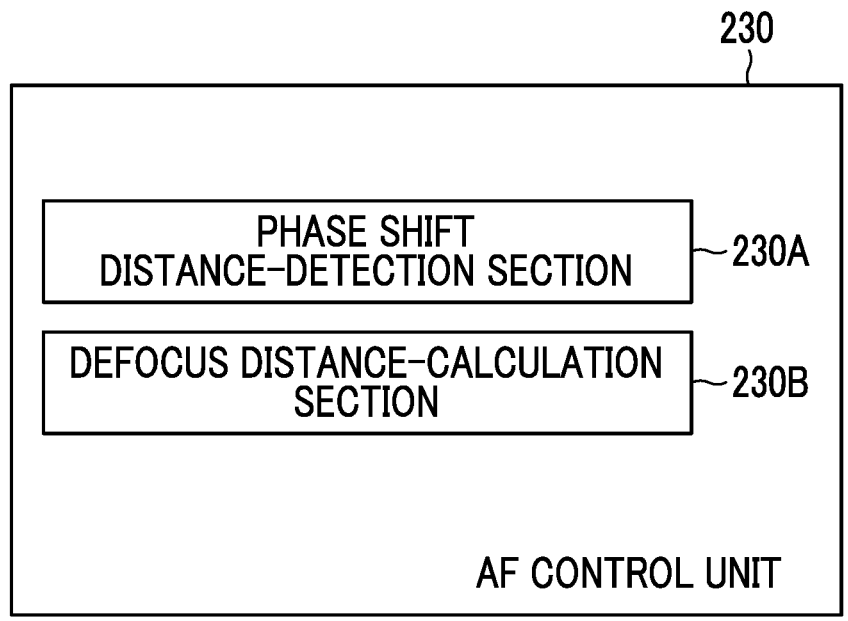
FIG. 11 is a diagram showing an example of the configuration of an AF control unit.

As shown in FIG. 11, the AF control unit 230 includes a phase shift distance-detection section 230A and a defocus distance-calculation section 230B.

The phase shift distance-detection section 230A (second phase shift distance-detection section) detects a phase shift distance on the basis of the outputs of the first phase difference pixels PA and the outputs of the second phase difference pixels PB in the AF area of the image sensor 201. The phase shift distance can be calculated from the amount of shift between the respective output data that are obtained in a case where a correlation between the respective output data of the first phase difference pixels PA and the respective output data of the second phase difference pixels PB is maximum (in a case where an integrated value of the absolute values of differences between the respective output data of the first phase difference pixels PA and the respective output data of the second phase difference pixels PB is minimum).

The defocus distance-calculation section 230B calculates a defocus distance by multiplying the phase shift distance, which is detected by the phase shift distance-detection section 230A, and a coefficient, which corresponds to the current F-Number (ray angle) of the interchangeable lens 100, together.

In the case of the interchangeable lens 100 having no compatibility as in this example, the interchangeable lens 100 cannot be controlled by the camera body 200 but a focus can be automatically adjusted in a case where the image sensor 201 is moved in the direction of the optical axis by the focus adjustment unit 209.

That is, in a case where the AF control unit 230 performs AF control, the AF control unit 230 drives and controls the focus adjustment unit 209 on the basis of the defocus distance calculated by the defocus distance-calculation section 230B and moves the image sensor 201 by the calculated defocus distance. Accordingly, since the image sensor 201 can be moved to a position where a defocus distance is zero (a position where a phase difference is minimum), phase-difference AF for focusing a subject image on the image forming surface of the image sensor 201 can be performed.

AF is not limited to phase-difference AF and may be, for example, contrast AF. In the case of contrast AF, the AF control unit 230 extracts high-frequency components from G signals of G pixels (pixels including G color filters) provided in an AF area, calculates an integrated value (focus evaluation value) of the absolute values of the extracted high-frequency components, and moves the image sensor 201 to a position where the calculated focus evaluation value is maximum (that is, a position where contrast is maximum) through the focus adjustment unit 209.

The brightness detection unit 232 (photometric unit) is a part that detects the brightness of a subject (subject luminance), and calculates a numerical value (exposure value (EV value)) that corresponds to subject luminance and is required for AE control and auto white balance (AWB) control. The brightness detection unit 232 calculates an EV value from the luminance of an image acquired through the image sensor 201 and a shutter speed and an F-Number at the time of acquisition of the luminance of the image.

In the case of the interchangeable lens 300 having compatibility, the body-side CPU 220 can determine an F-Number, a shutter speed, and ISO sensitivity from a predetermined program diagram on the basis of the EV value obtained from the brightness detection unit 232 and can perform AE control.

Further, in the case of the interchangeable lens 100 having no compatibility, the body-side CPU 220 can determine a shutter speed and ISO sensitivity so that the luminance of the image acquired through the image sensor 201 becomes appropriate luminance and can perform AE control.

The white balance correction unit 234 calculates white balance (WB) gains Gr, Gg, and Gb of the respective color data of RGB data (R data, G data, and B data), and multiplies the R data, the G data, and the B data by the calculated WB gains Gr, Gg, and Gb, respectively, to perform white balance correction. Here, a method including specifying the type of a light source illuminating a subject on the basis of the recognition of a scene (the determination of whether a scene is an outdoor scene or an indoor scene, and the like) using the brightness (EV value) of the subject, the color temperature of ambient light, and the like, and reading a WB gain corresponding to a specified type of a light source from a storage unit in which WB gains suitable for the types of light sources are stored in advance is considered as a method of calculating the WB gains Gr, Gg, and Gb; but other publicly known methods of obtaining WB gains Gr, Gg, and Gb using at least an EV value may be considered.

The wireless communication unit 236 is a part that performs near field communication corresponding to standards, such as Wireless Fidelity (Wi-Fi) (registered trademark) and Bluetooth (registered trademark), and transmits and receives necessary information to and from digital gadgets (portable terminals, such as a smartphone) positioned therearound.

The GPS receiver 238 receives GPS signals, which are transmitted from a plurality of GPS satellites, according to an instruction of the body-side CPU 220, performs positioning computation processing based on the plurality of received GPS signals, and acquires GPS information that includes the latitude, the longitude, and the altitude of the camera body 200. The acquired GPS information can be recorded in the header of an image file as additional information that represents a position where the taken image is taken.

The power control unit 240 supplies power supply voltage, which is supplied from the battery 242, to each part of the camera body 200 according to the command of the body-side CPU 220. Further, the power control unit 240 supplies power supply voltage, which is supplied from the battery 242, to each part of the interchangeable lens 300 having no compatibility through the body mount 260 and the lens mount 160 according to the command of the body-side CPU 220.

A lens power switch 244 performs the switching of ON and OFF of the power supply voltage, which is supplied to the interchangeable lens 300 through the body mount 260 and the lens mount 360 according to the command of the body-side CPU 220, and the switching of the level of the power supply voltage.

The body-side communication unit 250 transmits and receives a request signal and a response signal to and from (performs two-way communication with) the lens-side communication unit 350 of interchangeable lens 300, which is connected to the body-side communication unit 250 through the body mount 260 and the lens mount 360, according to the command of the body-side CPU 220. Since the body mount 260 is provided with a plurality of terminals 260A as shown in FIG. 1, the plurality of terminals 260A (FIG. 1) of the body mount 260 and the plurality of terminals (not shown) of the lens mount 360 are electrically connected to each other in a case where the interchangeable lens 300 is mounted on the camera body 200 (the lens mount 360 and the body mount 260 are connected to each other). Accordingly, two-way communication can be performed between the body-side communication unit 250 and the lens-side communication unit 350.

The built-in flash 30 (FIG. 1) is, for example, a Through The Lens (TTL) automatic dimming flash, and includes the flash light-emitting unit 270 and the flash control unit 272.

The flash control unit 272 has a function of adjusting the amount (guide number) of flash light that is emitted from the flash light-emitting unit 270. That is, the flash control unit 272 causes the flash light-emitting unit 270 to emit flash light in synchronization with a flash imaging instruction from the body-side CPU 220, starts the photometry of reflected light (including ambient light) that is incident through the imaging optical system 102 or 302 of the interchangeable lens 100 or 300, and stops the emission of the flash light from the flash light-emitting unit 270 in a case where a photometric value reaches a standard exposure value.

The focal-plane shutter (FPS) 280 forms the mechanical shutter of the imaging device 10, and is disposed right in front of the image sensor 201. The FPS control unit 296 controls the opening and closing of a front curtain and a rear curtain of the FPS 280 on the basis of information (an S2-on signal, a shutter speed, and the like) input from the body-side CPU 220 and controls the exposure time (shutter speed) of the image sensor 201.

[Principle of Information Acquisition Method]

Next, the principle of a method of acquiring information related to a ray angle with respect to the image sensor 201 in a case where the interchangeable lens 100 having no compatibility is mounted on the camera body 200 and subject light is incident on the image sensor 201 through the interchangeable lens 100 will be described. A case where a ray angle at the center of the image sensor 201 is acquired as information related to a ray angle with respect to the image sensor 201 will be described.

Figure 12:
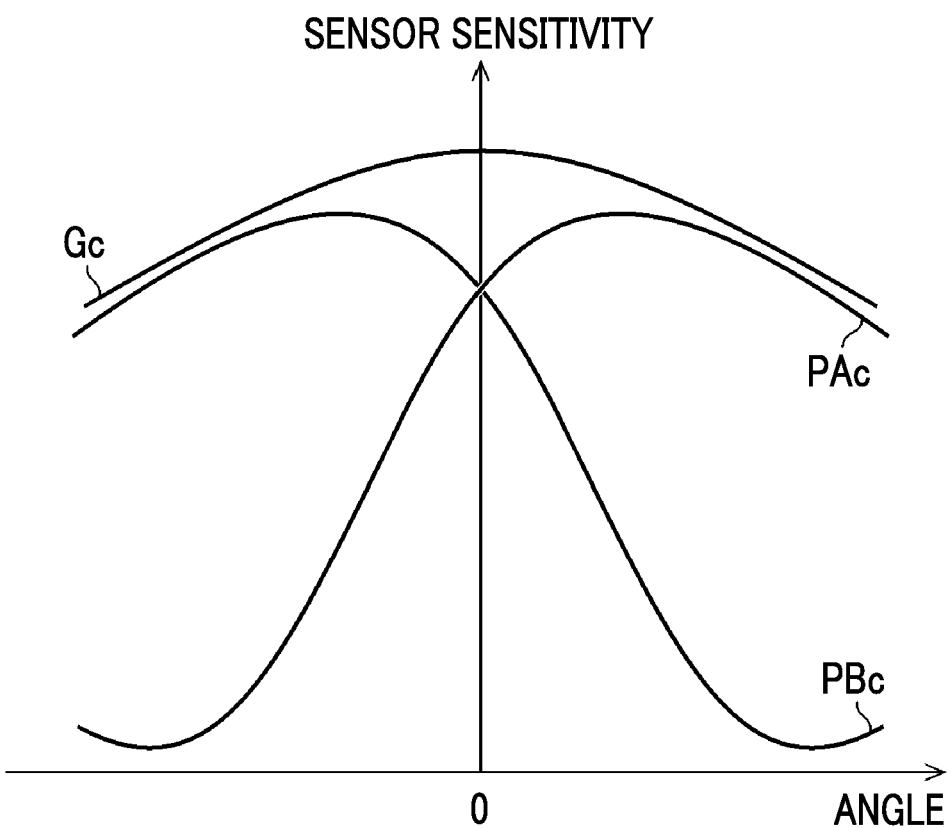
FIG. 12 is a graph showing the incidence angle characteristics of a normal pixel (G pixel), the first phase difference pixel, and the second phase difference pixel of the image sensor.

FIG. 12 is a graph showing the incidence angle characteristics of the normal pixel (G pixel), the first phase difference pixel PA, and the second phase difference pixel PB of the image sensor 201, and shows the sensitivity Gc of the normal pixel (G pixel), the sensitivity PAc of the first phase difference pixel PA, and the sensitivity PBc of the second phase difference pixel PB with respect to an angle between the image sensor 201 and the x direction (horizontal direction).

As shown in FIG. 12, the sensitivity Gc of the G pixel is highest and the sensitivities PAc and PBc of the first and second phase difference pixels PA and PB are lower than that of the G pixel. Further, light to be incident on the left half of the opening of the first phase difference pixel PA is blocked by the light blocking film MA and light to be incident on the right half of the opening of the second phase difference pixel PB is blocked by the light blocking film MB. Accordingly, the sensitivity PAc of the first phase difference pixel PA and the sensitivity PBc of the second phase difference pixel PB are symmetric with respect to a center where an incidence angle is zero, and the positions of the peaks of the sensitivities thereof are shifted from each other.

Figure 13:
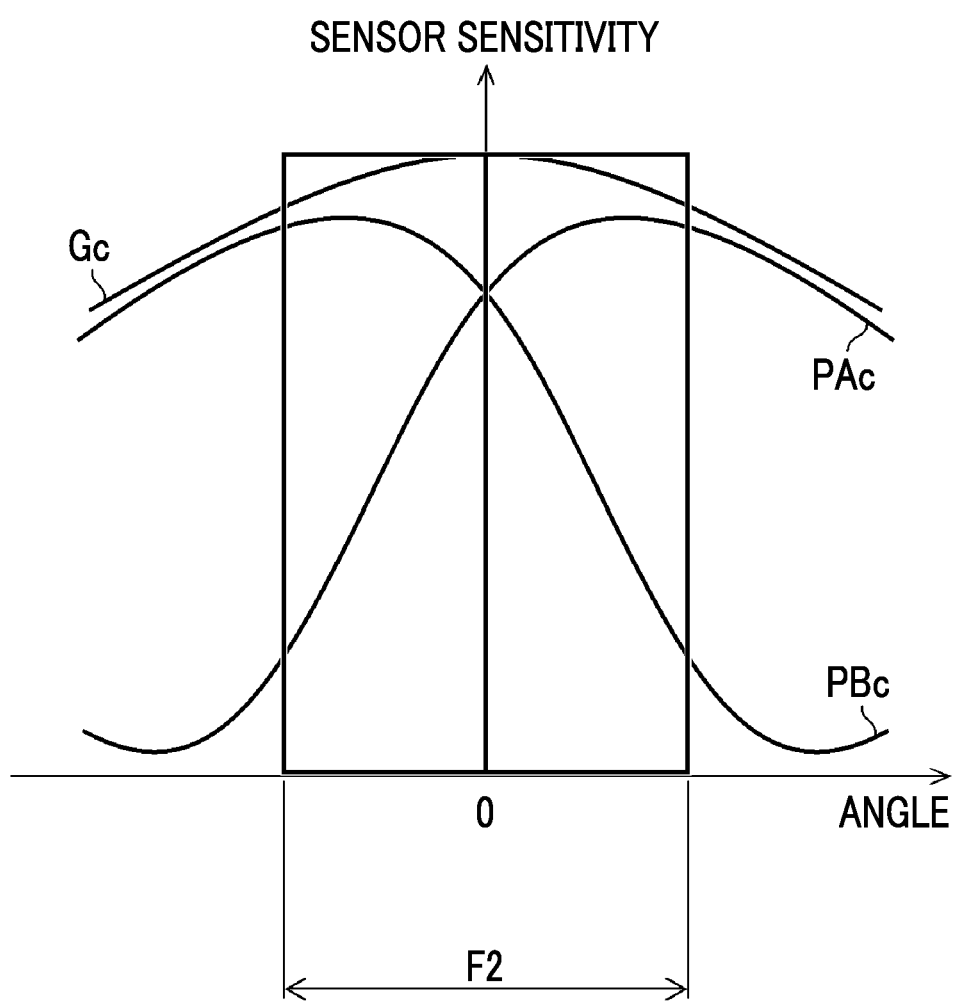
FIG. 13 is a diagram showing a graph that shows the incidence angle characteristics of the G pixel, the first phase difference pixel PA, and the second phase difference pixel PB of the image sensor and the angle range of luminous flux that is incident on pixels positioned at a central portion of the image sensor in a case where an F-Number is F2.
Figure 14:
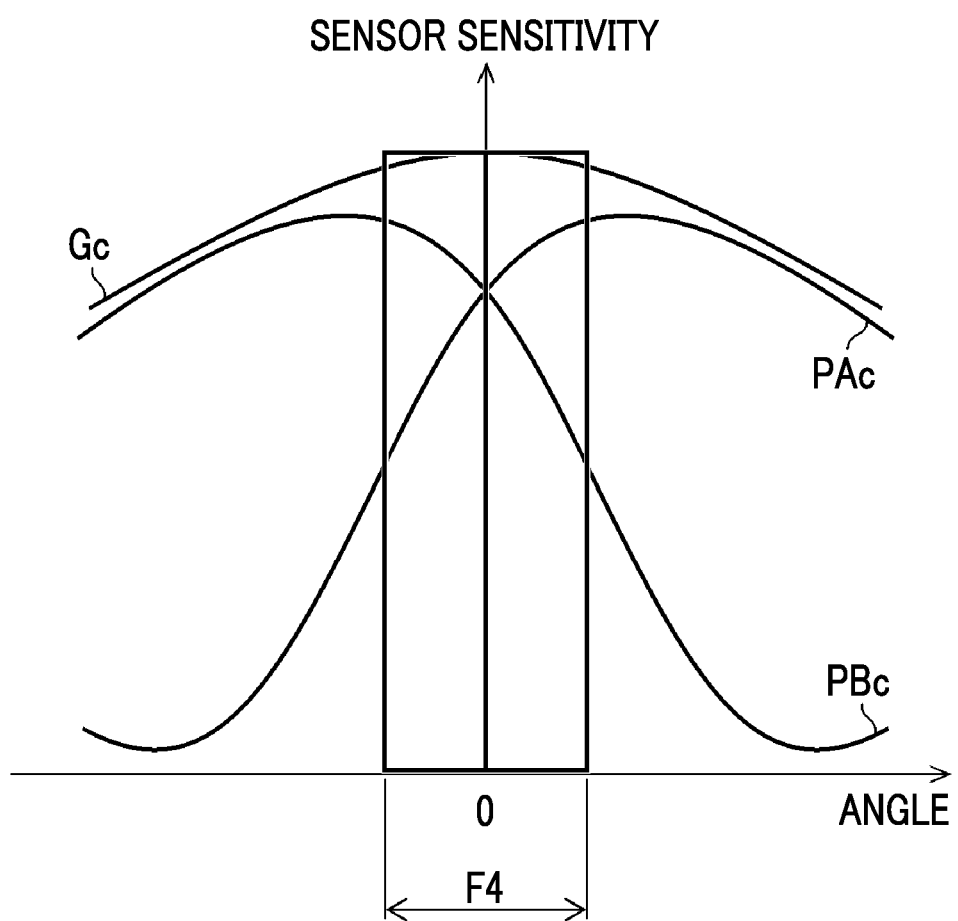
FIG. 14 is a diagram showing a graph that shows the incidence angle characteristics of the G pixel, the first phase difference pixel PA, and the second phase difference pixel PB of the image sensor and the angle range of luminous flux that is incident on pixels positioned at a central portion of the image sensor in a case where an F-Number is F4.

FIG. 13 is a diagram showing the graph (the graph shown in FIG. 12) that shows the incidence angle characteristics of the G pixel, the first phase difference pixel PA, and the second phase difference pixel PB of the image sensor 201 and the angle range of luminous flux that is incident on pixels (the G pixel, the first phase difference pixel PA, and the second phase difference pixel PB) positioned at a central portion of the image sensor 201 in a case where the F-Number of the interchangeable lens 100 is F2; and FIG. 14 is a diagram showing the graph that shows the incidence angle characteristics of the G pixel, the first phase difference pixel PA, and the second phase difference pixel PB of the image sensor 201 and the angle range of luminous flux that is incident on the pixels positioned at the central portion of the image sensor 201 in a case where the F-Number of the interchangeable lens 100 is F4.

As also apparent from FIGS. 13 and 14, the angle range of luminous flux incident on the pixels positioned at the central portion of the image sensor 201 (that is, a ray angle with respect to the image sensor 201) is larger as the F-Number of the interchangeable lens 100 is smaller.

Figure 15:
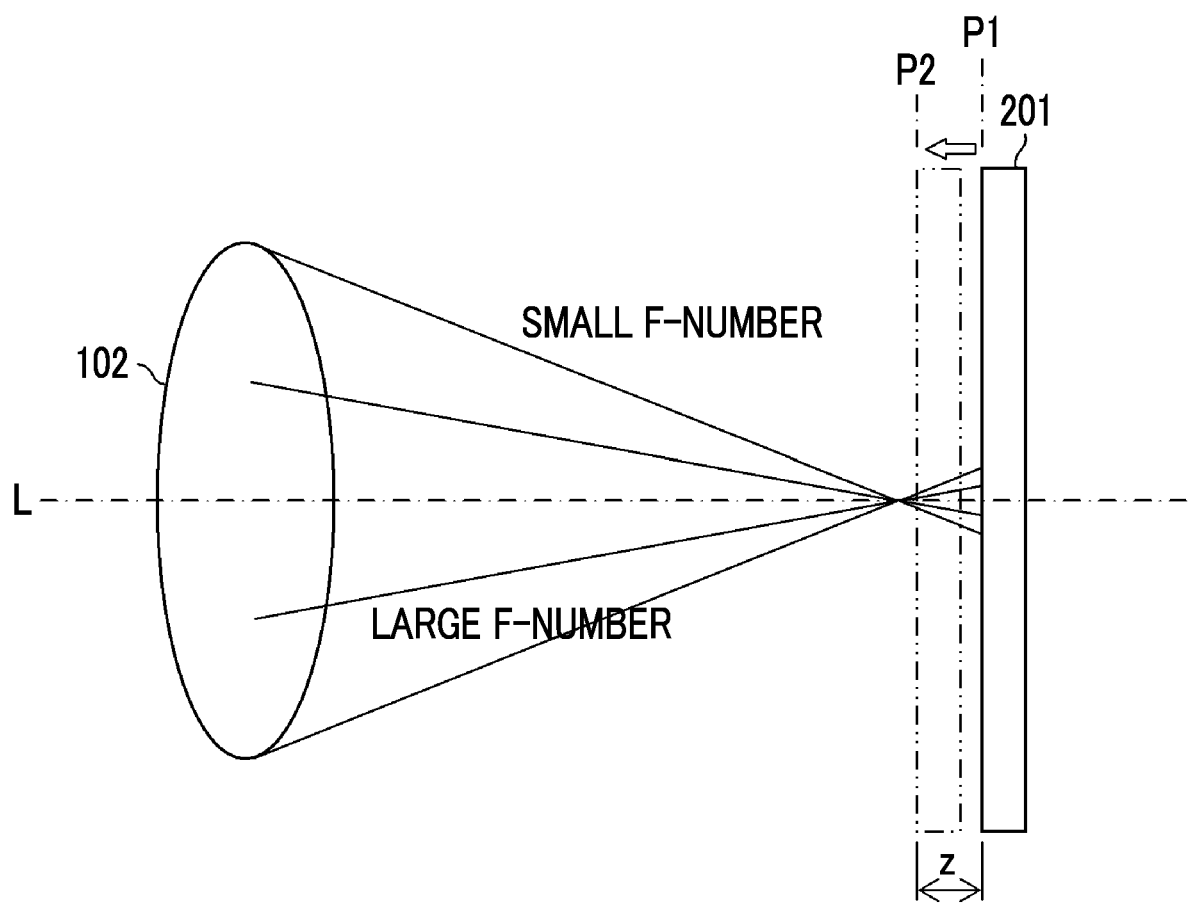
FIG. 15 is a diagram showing an aspect where the image sensor is moved to a first position P1 and a second position P2 and a first phase shift distance at the first position P1 and a second phase shift distance at the second position P2 are acquired.

Now, in a case where the image sensor 201 is moved to a second position P2 from a first position P1 in the direction of an optical axis L of the imaging optical system 102 of the interchangeable lens 100 as shown in FIG. 15, it is found that a phase shift distance (first phase shift distance) detected by the first and second phase difference pixels PA and PB at the first position P1 is different from a phase shift distance (second phase shift distance) detected by the first and second phase difference pixels PA and PB at the second position P2. Further, the first phase shift distance and the second phase shift distance also vary depending on the magnitude of the F-Number of the interchangeable lens 100 (the magnitude of a ray angle).

Accordingly, a first phase shift distance in a case where the image sensor 201 is positioned at the first position P1 and a second phase shift distance in a case where the image sensor 201 is moved from the first position P1 and is positioned at the second position are detected, so that information related to a ray angle with respect to the image sensor 201 in a case where subject light is incident on the image sensor 201 through the interchangeable lens 100 can be acquired.

Figure 16:
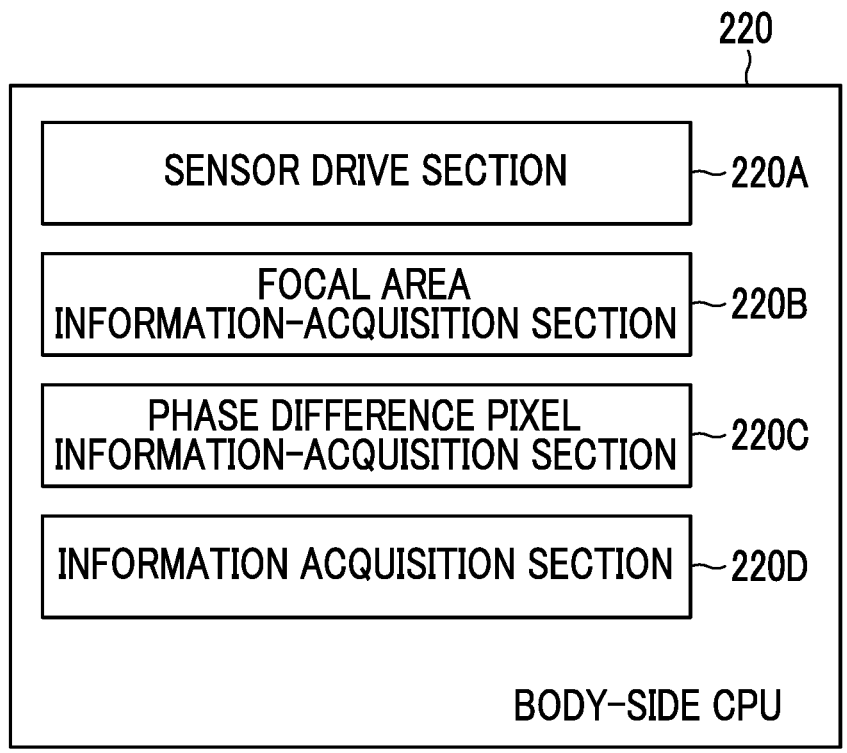
FIG. 16 is a block diagram showing the functions of a body-side CPU of a camera body that acquires information related to a ray angle with respect to the image sensor.

FIG. 16 is a block diagram showing the functions of the body-side CPU 220 of the camera body 200 that acquires information related to a ray angle with respect to the image sensor 201 in a case where subject light is incident on the image sensor 201 through the interchangeable lens 100.

As shown in FIG. 16, the body-side CPU 220 (imaging device) functions as various processing units by executing an information acquisition program stored in the flash ROM 226 or the ROM 228, and has functions as a sensor driver (sensor drive section) 220A, a focal area information-acquisition section 220B, a phase difference pixel information-acquisition section 220C, and an information acquisition section 220D in this embodiment. A medium in which the information acquisition program is stored may be non-transitory computer-readable recording mediums, such as a hard disk, a compact disk (CD), a digital versatile disk (DVD), and various semiconductor memories.

The operation unit 222 of the imaging device 10 is provided with a mode setting section that is used to set an information acquisition mode (F-Number acquisition mode). In a case where a user operates the stop ring of the interchangeable lens 100 to switch the F-Number of the stop 108, the user operates the mode setting section to set the F-Number acquisition mode and performs imaging for acquiring an F-Number. It is preferable that the imaging for acquiring an F-Number is to image a subject having high contrast. The reason for this is that phase shift distances (the first and second phase shift distances) between the respective output data of the first and second phase difference pixels PA and PB can be accurately detected on the basis of the respective output data of the first and second phase difference pixels PA and PB in a focus adjustment area in the entire area of the image sensor 201 in a case where an F-Number is acquired.

In a case where an imaging instruction is input from the shutter release switch 22 functioning as the imaging instruction unit in a state where the F-Number acquisition mode is set by the mode setting section, the sensor driver 220A, the focal area information-acquisition section 220B, the phase difference pixel information-acquisition section 220C, and the information acquisition section 220D of the body-side CPU 220 perform operations for acquiring an F-Number to be described below.

The sensor driver 220A is a part that moves the image sensor 201 in the direction of the optical axis of the interchangeable lens 100 through the focus adjustment unit 209, and moves the image sensor 201 to the first position P1 and the second position P2 (see FIG. 15).

The first position P1 may be the home position of the image sensor 201, and may be any position where a phase shift distance can be accurately detected in a case where a phase shift distance cannot be accurately detected due to great blurring.

It is preferable that the sensor driver 220A moves the image sensor 201 from the first position P1 by a defined distance z in a direction toward a focusing position where a subject is in focus through the focus adjustment unit 209. A position to which the image sensor 201 is moved from the first position P1 by the defined distance z is the second position P2. The reason for this is that a phase difference cannot be detected well at the second position P2 in a case where the image sensor 201 is moved from the first position P1 where a phase difference can be detected in a direction opposite to the direction toward the focusing position where a subject is in focus.

The focal area information-acquisition section 220B is a part that acquires focal area information representing a focus adjustment area in the entire area of the image sensor 201, and acquires a preset focus adjustment area, such as a sensor center area, an area where a main subject, such as the facial area of a person, is present, or an area having high contrast as the focal area information representing the focus adjustment area.

The phase difference pixel information-acquisition section 220C is to acquire the respective output data of the first and second phase difference pixels PA and PB, which are positioned in the focus adjustment area acquired by the focal area information-acquisition section 220B, among the first and second phase difference pixels PA and PB provided in the image sensor 201, and acquires the respective output data of the first and second phase difference pixels PA and PB in a case where the image sensor 201 is positioned at the first position P1 and the respective output data of the first and second phase difference pixels PA and PB in a case where the image sensor 201 is positioned at the second position P2.

The information acquisition section 220D acquires information related to a ray angle with respect to the image sensor 201 in a case where subject light is incident on the image sensor 201 through the interchangeable lens 100 on the basis of the respective output data of the first and second phase difference pixels PA and PB at the first and second positions P1 and P2.

The information acquisition section 220D can detect phase shift distances at the respective first and second positions P1 and P2 on the basis of the respective output data of the first and second phase difference pixels PA and PB at the first and second positions P1 and P2. The amount of change between the phase shift distances detected at the first and second positions P1 and P2 varies depending on the moving distance of the image sensor 201 and the magnitude of the F-Number of the interchangeable lens 100 (the magnitude of a ray angle), but a ray angle can be calculated from the moving distance of the image sensor 201 and the amount of change in a phase shift distance in a case where the moving distance of the image sensor 201 has been already known.

Figure 17:
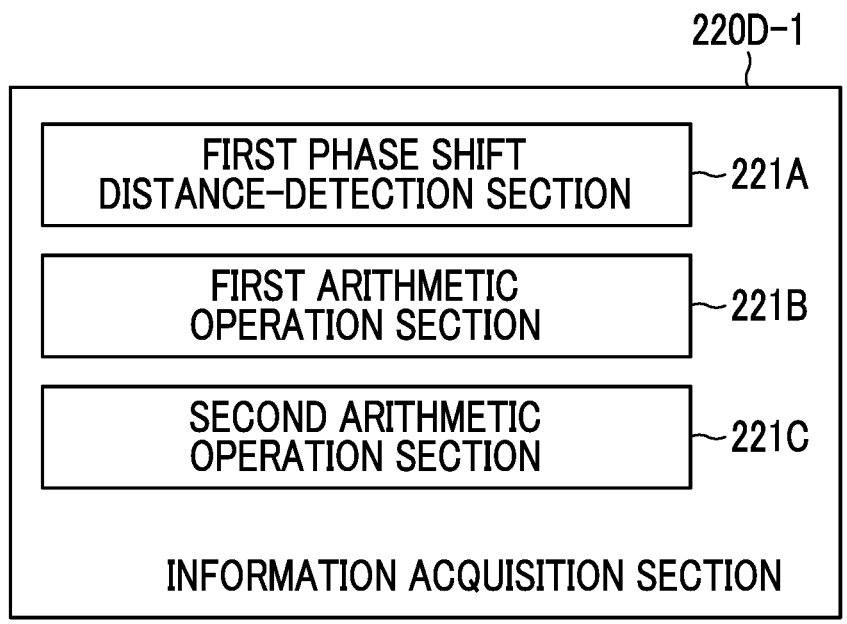
FIG. 17 is a functional block diagram showing a first embodiment of the processing of an information acquisition section shown in FIG. 16.

FIG. 17 is a functional block diagram showing a first embodiment of the processing of the information acquisition section 220D shown in FIG. 16, and particularly shows a case where a ray angle is calculated as information related to a ray angle with respect to the image sensor 201.

An information acquisition section 220D-1 shown in FIG. 17 mainly includes a first phase shift distance-detection section 221A, a first arithmetic operation section 221B, and a second arithmetic operation section 221C.

The first phase shift distance-detection section 221A detects a first phase shift distance at the first position P1 on the basis of the outputs of the first and second phase difference pixels PA and PB of the image sensor 201 in a case where the image sensor 201 is positioned at the first position P1, and detects a second phase shift distance at the second position P2 on the basis of the outputs of the first and second phase difference pixels PA and PB of the image sensor 201 in a case where the image sensor 201 is positioned at the second position P2.

Figure 18:
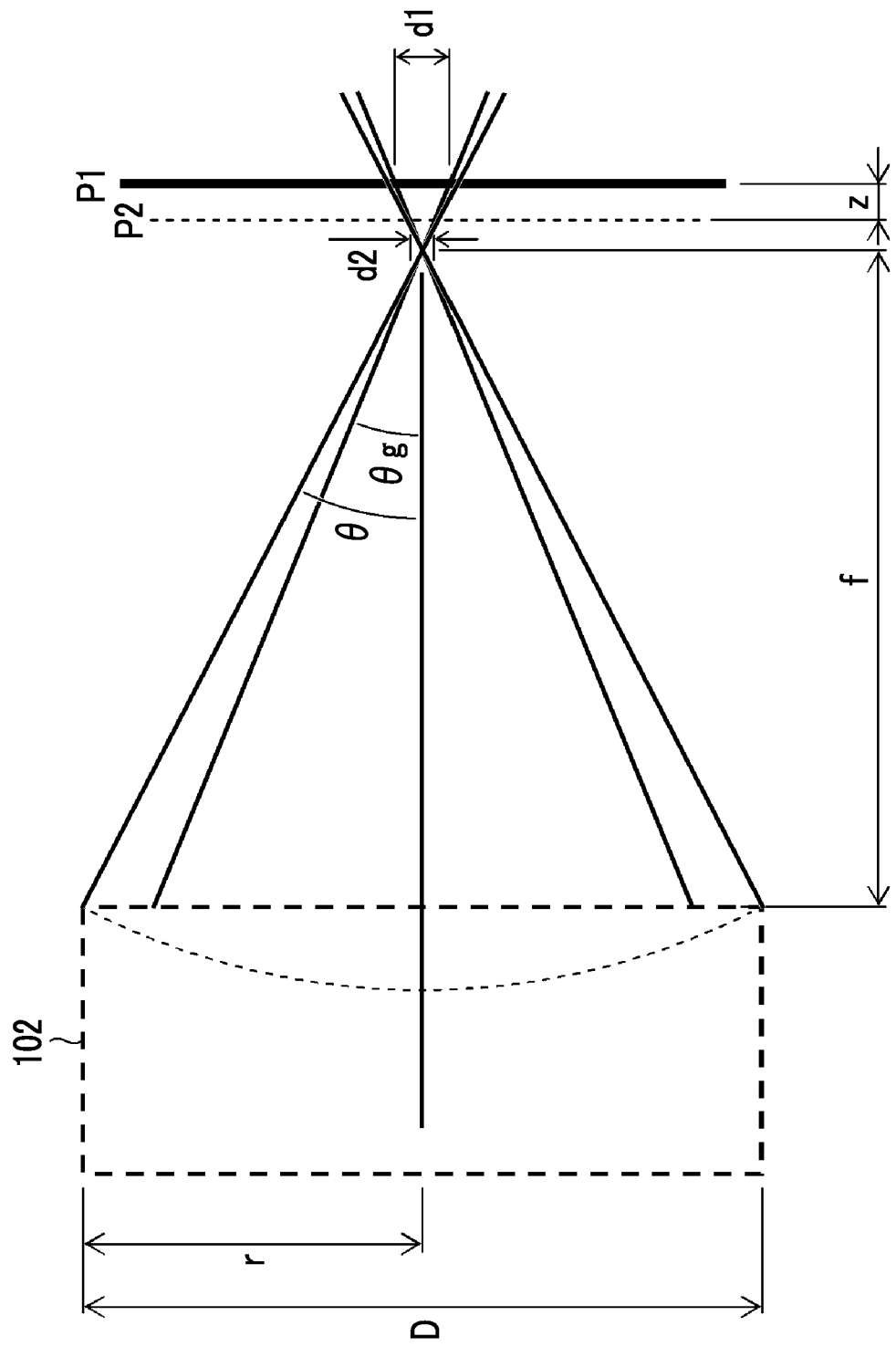

FIG. 18 shows a first phase shift distance d1 at the first position P1 and a second phase shift distance d2 at the second position P2 that are detected by the first phase shift distance-detection section 221A. Since the detection of the phase shift distances based on the outputs of the first and second phase difference pixels PA and PB of the image sensor 201 is performed in the same manner as that in the case of the phase shift distance-detection section 230A (second phase shift distance-detection section), the detailed description thereof will be omitted here.

The first arithmetic operation section 221B calculates a difference $\Delta d$ ($=d1-d2$) between the first phase shift distance d1 at the first position P1 and the second phase shift distance d2 at the second position P2 that are detected by the first phase shift distance-detection section 221A.

The second arithmetic operation section 221C calculates a ray angle $\theta$ at the center of the image sensor 201 on the basis of the difference $\Delta d$ calculated by the first arithmetic operation section 221B and a moving distance (defined distance z) between the first and second positions P1 and P2 where the image sensor 201 is moved.

Figure 19:
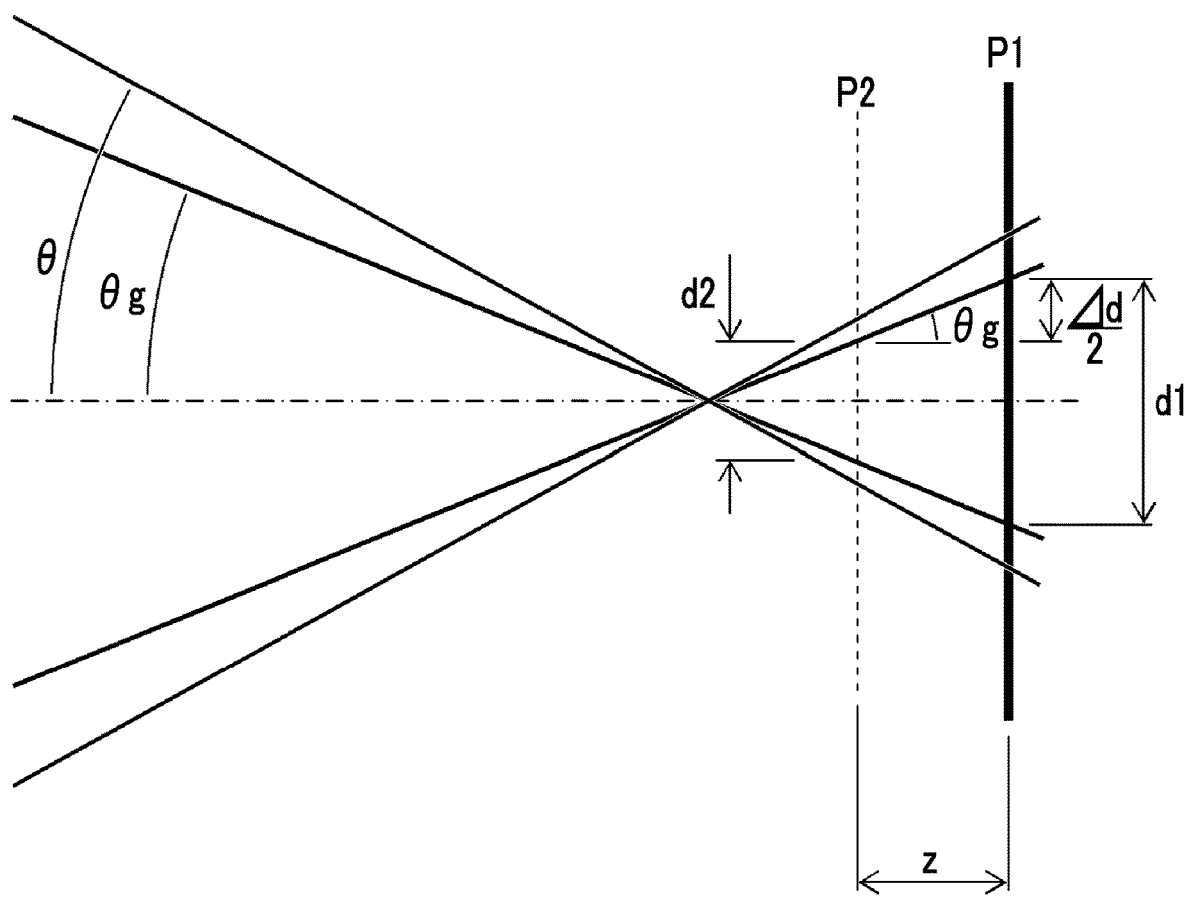
FIG. 19 is an enlarged view of main portions of FIG. 18.

FIG. 19 is an enlarged view of main portions of FIG. 18.

As shown in FIG. 19, an angle (an angle $\theta g$ shown in FIG. 19) at the center of the image sensor 201 defined by the first phase shift distance d1 and the second phase shift distance d2 can be expressed by the following equation from the difference $\Delta d$ calculated by the first arithmetic operation section 221B and the defined distance z.

$$\tan \theta g = (\Delta d/2)/z$$

$$\theta g = \tan^{-1}(\Delta d/2z) \qquad \text{[Equation 1]}$$

The second arithmetic operation section 221C can calculate the angle $\theta g$ by [Equation 1] from the difference $\Delta d$ calculated by the first arithmetic operation section 221B and the defined distance z.

As shown in FIG. 18, the ray angle $\theta$ at the center of the image sensor 201 is an angle between the main ray (in this case, the optical axis L) of luminous flux incident on the center of the image sensor 201 and an upper ray (a ray passing through an upper edge of the exit pupil or the entrance pupil).

The angle θg calculated by [Equation 1] is an angle that reflects the incidence angle characteristics (see FIG. 12) of the first and second phase difference pixels PA and PB of the image sensor 201, and is an angle smaller than the ray angle θ.

Here, in a case where the incidence angle characteristics of the first phase difference pixel PA or second phase difference pixel PB are denoted by I(θ), the angle θg and the ray angle θ are in a relationship of the following equation.

$$\theta g = \Sigma(\theta \times I(\theta))/\Sigma\theta \qquad \text{[Equation 2]}$$

Accordingly, the second arithmetic operation section 221C can obtain the ray angle θ on the basis of the calculated angle θg. For example, it is possible to obtain the ray angle θ (to convert the angle θg into the ray angle θ) by multiplying the angle θg and a correction coefficient, which represents a relationship between the angle θg and the ray angle θ, together.

Since the relationship between the angle θg and the ray angle θ depends on incidence angle characteristics, it is preferable that a correction table (a correction table in which correction coefficients are stored for every image height) is prepared in advance for the relationship between the angle θg and the ray angle θ and a correction coefficient corresponding to an image height is used.

Figure 20:
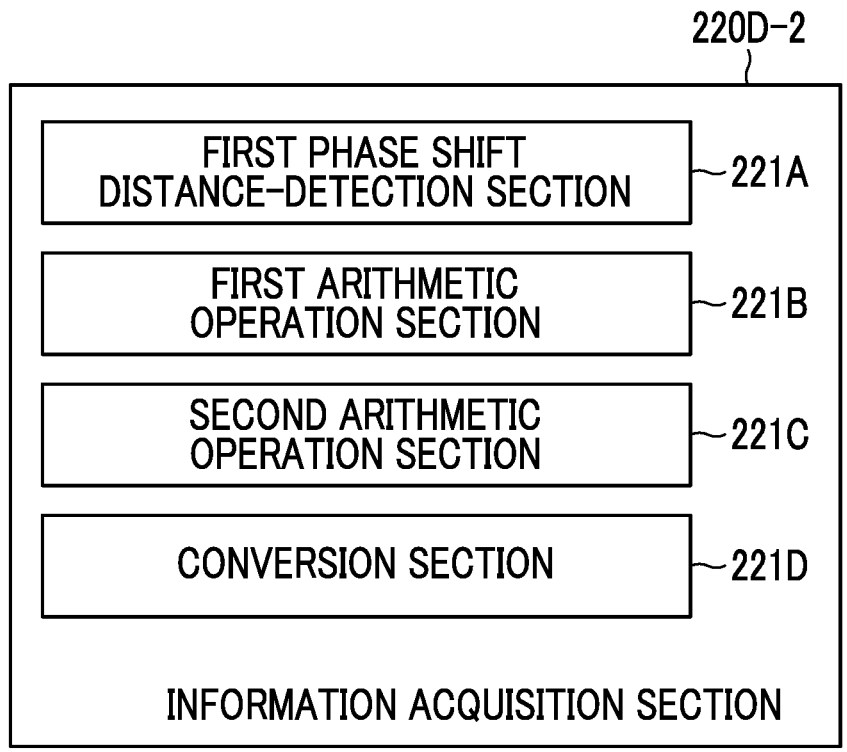
FIG. 20 is a functional block diagram showing a second embodiment of the processing of the information acquisition section shown in FIG. 16.

FIG. 20 is a functional block diagram showing a second embodiment of the processing of the information acquisition section 220D shown in FIG. 16. Sections shown in FIG. 20 common to the first embodiment shown in FIG. 17 are denoted by the same reference numerals as those of FIG. 17, and the detailed description thereof will be omitted.

An information acquisition section 220D-2 of the second embodiment shown in FIG. 20 is different from that of the first embodiment shown in FIG. 17 in that a conversion section 221D is added.

The conversion section 221D converts the ray angle θ, which is calculated by the second arithmetic operation section 221C, into an F-Number or a numerical aperture by a predetermined conversion formula.

The conversion formula, which converts the ray angle θ into an F-Number or a numerical aperture, will be described below with reference to FIG. 18.

In FIG. 18, the aperture diameter of the imaging optical system 102 is denoted by D, the radius of the aperture diameter D is denoted by r, the focal length thereof is denoted by f, and the ray angle is denoted by θ.

An F-Number can be represented by the following equation using the definition of an F-Number.

$$F = f/D \qquad \text{[Equation 3]}$$

Further, in a case where sine conditions are satisfied in the aperture diameter D, the radius r of the aperture diameter D, the focal length f, and the ray angle θ of the imaging optical system 102 shown in FIG. 18, sin θ can be represented by the following equation.

$$\sin \theta = r/f = D/(2f) \qquad \text{[Equation 4]}$$

An F-Number can be represented from [Equation 3] and [Equation 4] by the following equation.

$$F = 1/(2 \sin \theta) \qquad \text{[Equation 5]}$$

Further, a numerical aperture NA in the air can be represented by the following equation.

$$NA = \sin \theta \qquad \text{[Equation 6]}$$

Furthermore, an F-Number and a numerical aperture are related to each other by the following equation.

$$F = 1/(2NA) \qquad \text{[Equation 7]}$$

An F-Number, a numerical aperture, and a ray angle are related to each other as described above. Accordingly, in a case where one of these is known, the other two thereof can be converted.

The conversion section 221D of this example can convert the ray angle θ, which is calculated by the second arithmetic operation section 221C, into an F-Number or a numerical aperture using [Equation 5] or [Equation 6].

Further, since a value (sin θ) corresponding to the ray angle θ is calculated as shown in [Equation 4], an F-Number can be calculated in a case where this value (sin θ) is substituted into [Equation 5]. Furthermore, in a case where an F-Number is calculated, a numerical aperture NA can be calculated from [Equation 7].

Figure 21:
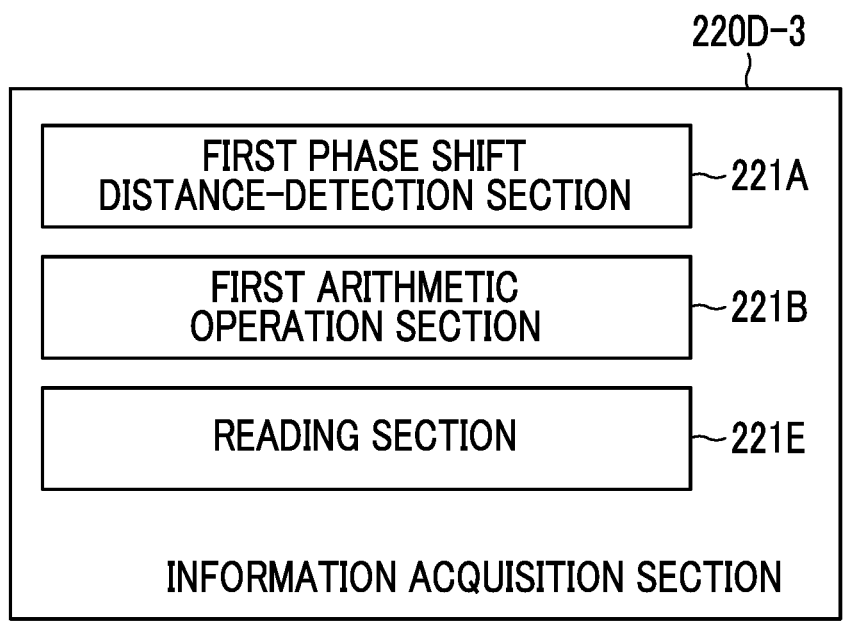
FIG. 21 is a functional block diagram showing a third embodiment of the processing of the information acquisition section shown in FIG. 16.

FIG. 21 is a functional block diagram showing a third embodiment of the processing of the information acquisition section 220D shown in FIG. 16. Sections shown in FIG. 21 common to the first embodiment shown in FIG. 17 are denoted by the same reference numerals as those of FIG. 17, and the detailed description thereof will be omitted.

An information acquisition section 220D-3 of the third embodiment shown in FIG. 21 is different from that of the first embodiment shown in FIG. 17 in that a reading section 221E is provided instead of the second arithmetic operation section 221C mainly calculating a ray angle θ.

The reading section 221E acquires the current F-Number of the interchangeable lens 100 on the basis of the difference Δd that is calculated by the first arithmetic operation section 221B.

Specifically, the imaging device 10 comprises a storage unit, such as the flash ROM 226 or the ROM 228, in which the difference Δd calculated by the first arithmetic operation section 221B and each F-Number of the interchangeable lens 100 are stored in advance in association with each other. A table representing a relationship between the difference Δd and an F-Number may be stored in the ROM 228 before the shipment of products, or a table representing a relationship between the difference Δd and an F-Number may be downloaded from a server on the network and may be stored in the flash ROM 226.

The reading section 221E reads an F-Number corresponding to the difference Δd, which is calculated by the first arithmetic operation section 221B, from the flash ROM 226 or the ROM 228 on the basis of the difference Δd, and acquires the read F-Number as the current F-Number of the interchangeable lens 100.

In a case where the calculated difference Δd and the F-Number corresponding to the difference Δd are not stored in the flash ROM 226 or the ROM 228, a difference Δd closer to the calculated difference Δd may be employed on the basis of the calculated difference Δd and two differences Δd, which are stored in the front and rear of the calculated difference Δd, to read one F-Number of two F-Numbers corresponding to the two stored differences Δd, or two F-Numbers corresponding to two differences Δd, which are stored with the calculated difference Δd interposed therebetween, may be interpolated on the basis of the calculated difference Δd and the two stored differences Δd, to calculate an F-Number.

The difference Δd calculated by the first arithmetic operation section 221B and each numerical aperture of the interchangeable lens 100 may be stored in the storage unit, such as the flash ROM 226 or the ROM 228, in association with each other. In this case, the current numerical aperture of the interchangeable lens 100 can be read on the basis of the difference Δd calculated by the first arithmetic operation section 221B.

Further, a value, which is obtained in a case where the difference Δd is divided by the moving distance of the image sensor 201 (the defined distance z), may be used instead of the difference Δd.

According to these embodiments, even in a case where the interchangeable lens 100 having no compatibility is mounted on the camera body 200, the current ray angle, the current F-Number, or the current numerical aperture of the interchangeable lens 100 can be simply and accurately acquired. Further, since the current ray angle, the current F-Number, or the current numerical aperture of the interchangeable lens 100 can be acquired without the addition of special hardware in the case of the imaging device 10 having a function of performing phase-difference AF by moving the image sensor 201 including phase difference pixels in the direction of the optical axis, the imaging device 10 can be provided as an inexpensive device. In a case where the interchangeable lens 300 having compatibility is mounted on the camera body 200, the interchangeable lens 300 and the camera body 200 can communicate with each other and the camera body 200 can acquire lens information including an F-Number from the interchangeable lens 300 through communication. Accordingly, a ray angle, an F-Number, or a numerical aperture does not need to be acquired by this embodiment.

Further, in a case where "F-Number" of the interchangeable lens 100 is acquired, the brightness of a subject (not the luminance of an image but the brightness of a real subject) can be calculated on the basis of information about "a shutter speed" and "the luminance (brightness) of an image". Furthermore, the brightness of a real subject is used for the recognition of a scene (the determination of whether a scene is an outdoor scene or an indoor scene, and the like), and can be used for automatic white balance adjustment and the like.

Moreover, even in a case where the interchangeable lens 100 having no compatibility is mounted on the camera body 200, an F-Number or a numerical aperture can be recorded in the header of an image file as the additional information of a taken image.

[Information Acquisition Method]

Figure 22:
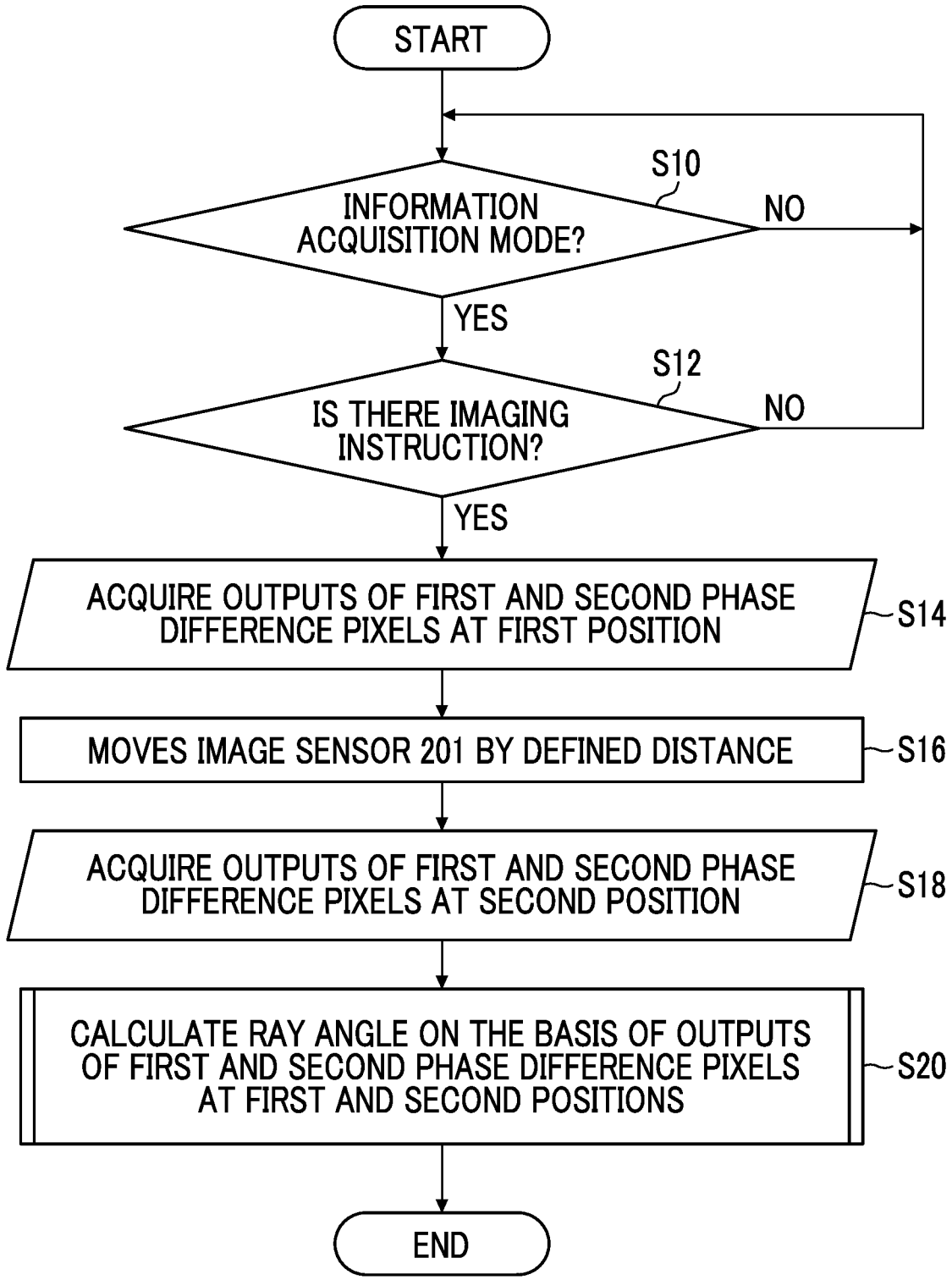
FIG. 22 is a flowchart showing a first embodiment of an information acquisition method according to the invention.

FIG. 22 is a flowchart showing a first embodiment of an information acquisition method according to the invention.

In FIG. 22, the body-side CPU 220 determines whether or not the F-Number acquisition mode (information acquisition mode) is set by the operation unit 222 (Step S10). In a case where the F-Number acquisition mode is set, the body-side CPU 220 further determines whether or not an imaging instruction (S2-on signal) is output from the shutter release switch 22 (Step S12).

In a case where the F-Number acquisition mode is set and an S2-on signal is output, the body-side CPU 220 performs imaging for acquiring an F-Number.

That is, the phase difference pixel information-acquisition section 220C acquires the respective output data of the first and second phase difference pixels PA and PB in a case where the image sensor 201 is positioned at the first position P1, that is, the respective output data of the first and second phase difference pixels PA and PB in the focus adjustment area (Step S14).

Then, the sensor driver 220A moves the image sensor 201 from the first position P1 by a defined distance z in a direction toward a focusing position where a subject is in focus (Step S16). A position to which the image sensor 201 is moved from the first position P1 by the defined distance z is the second position P2.

As in Step S14, the phase difference pixel information-acquisition section 220C acquires the respective output data of the first and second phase difference pixels PA and PB in a case where the image sensor 201 is positioned at the second position P2 (Step S18).

The information acquisition section 220D acquires a ray angle with respect to the image sensor in a case where subject light is incident on the image sensor 201 through the interchangeable lens 100 or information related to the ray angle on the basis of the respective output data of the first and second phase difference pixels PA and PB at the first and second positions P1 and P2 (Step S20).

Figure 23:
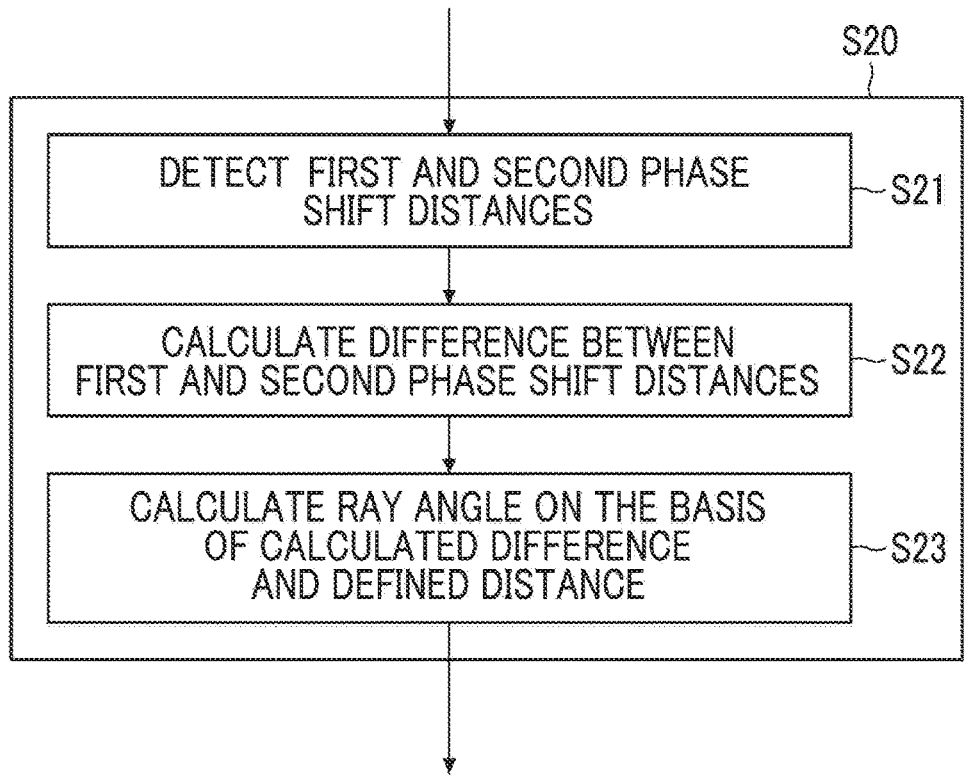
FIG. 23 is a flowchart showing the details of Step S20 shown in FIG. 22.

FIG. 23 is a flowchart showing the details of Step S20 shown in FIG. 22.

In FIG. 23, the first phase shift distance-detection section 221A (FIG. 17) detects a first phase shift distance at the first position P1 on the basis of the outputs of the first and second phase difference pixels PA and PB of the image sensor 201 in a case where the image sensor 201 is positioned at the first position P1, and detects a second phase shift distance at the second position P2 on the basis of the outputs of the first and second phase difference pixels PA and PB of the image sensor 201 in a case where the image sensor 201 is positioned at the second position P2 (Step S21).

Then, the first arithmetic operation section 221B calculates a difference Δd between the first phase shift distance d1 at the first position P1 and the second phase shift distance d2 at the second position P2 that are detected in Step S21 (Step S22).

The second arithmetic operation section 221C calculates a ray angle θ at the center of the image sensor 201 on the basis of the difference Δd calculated in Step S22 and a moving distance (defined distance z) between the first and second positions P1 and P2 where the image sensor 201 is moved (Step S23, see [Equation 1]).

Figure 24:
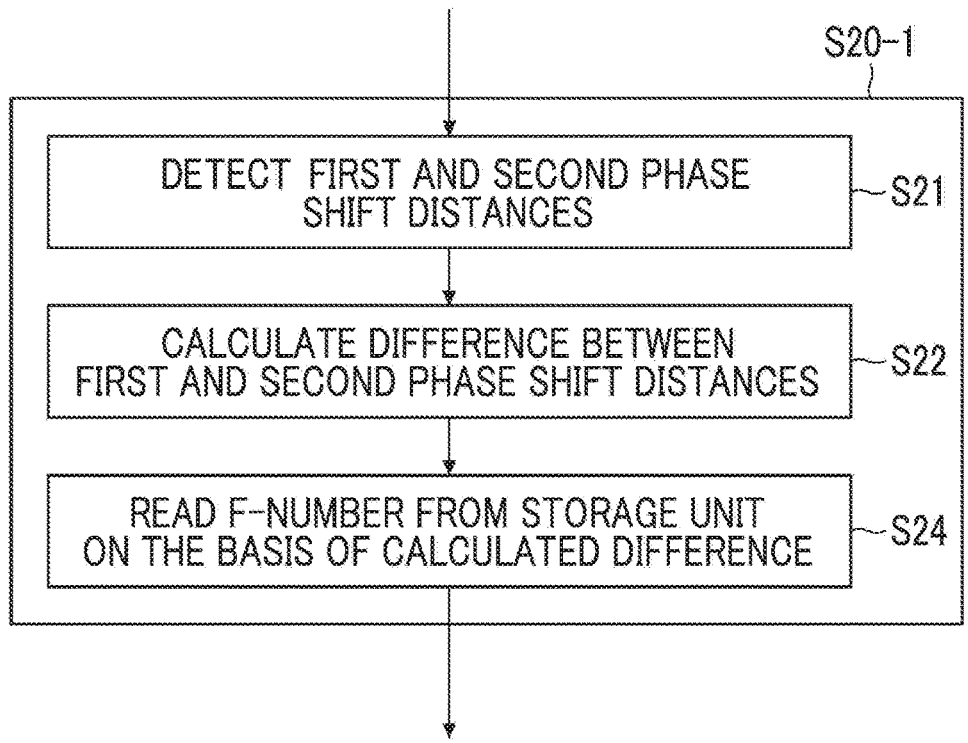
FIG. 24 is a flowchart showing another processing method corresponding to Step S20 shown in FIG. 22.

FIG. 24 is a flowchart showing another processing method corresponding to Step S20 shown in FIG. 22. Portions shown in FIG. 24 common to those shown in FIG. 23 are denoted by the same reference numerals as those of FIG. 23, and the detailed description thereof will be omitted.

The flowchart shown in FIG. 24 is different from the flowchart shown in FIG. 23 in that Step S24 of reading an F-Number is provided instead of Step S23 of calculating a ray angle θ.

The imaging device 10 comprises a storage unit, such as the flash ROM 226 or the ROM 228, in which the difference Δd calculated by the first arithmetic operation section 221B and each F-Number of the interchangeable lens 100 are stored in advance in association with each other.

In Step S24 shown in FIG. 24, the reading section 221E (FIG. 21) reads an F-Number corresponding to the difference Δd, which is calculated in Step S22, from the storage unit, such as the flash ROM 226 or the ROM 228, on the basis of the difference Δd. The reading section 221E acquires the read F-Number as the current F-Number of the interchangeable lens 100.

The difference Δd and each numerical aperture of the interchangeable lens 100 may be stored in the storage unit, such as the flash ROM 226 or the ROM 228, in association with each other. In this case, the current numerical aperture of the interchangeable lens 100 can be read on the basis of the difference Δd calculated in Step S22.

[Others]

In this embodiment, the sensor driver 220A is adapted to move the image sensor 201 to the first position P1 and the second position P2 through the focus adjustment unit 209. However, the sensor driver 220A is not limited thereto, and may be adapted to move the image sensor 201 to three or more positions including the first and second positions P1 and P2. In this case, it is preferable that the phase difference pixel information-acquisition section 220C acquires the outputs of the first and second phase difference pixels PA and PB of the image sensor 201 in a case where the image sensor 201 is moved to each of the three or more positions and the information acquisition section 220D acquires information related to a ray angle with respect to the image sensor 201 in a case where subject light is incident on the image sensor 201 through the interchangeable lens 100 on the basis of the outputs of the first and second phase difference pixels PA and PB at each of the three or more positions. Accordingly, information related to a more accurate ray angle can be acquired.

Further, the image sensor applied to the invention includes both the normal pixels and the phase difference pixels (first and second phase difference pixels), but an image sensor including only phase difference pixels without including normal pixels may be applied. In the case of the image sensor including only phase difference pixels, the same outputs as the normal pixels can be obtained through the addition of the outputs of a pair of first and second phase difference pixels adjacent to each other.

Furthermore, in this embodiment, the hardware structures of processing units, which perform various kinds of processing, such as the sensor driver 220A, the focal area information-acquisition section 220B, the phase difference pixel information-acquisition section 220C, and the information acquisition section 220D, are various processors to be described later. Various processors include: a central processing unit (CPU) that is a general-purpose processor functioning as various processing units by executing software (program); a programmable logic device (PLD) that is a processor of which the circuit configuration can be changed after the manufacture, such as a field programmable gate array (FPGA); a dedicated electrical circuit that is a processor having circuit configuration designed exclusively to perform specific processing, such as an application specific integrated circuit (ASIC); and the like.

One processing unit may be formed of one of these various processors, or may be formed of two or more same kind or different kinds of processors (for example, a combination of a plurality of FPGAs or a combination of a CPU and an FPGA). Further, a plurality of processing units may be formed of one processor. As an example where a plurality of processing units are formed of one processor, first, there is an aspect where one processor is formed of a combination of one or more CPUs and software as typified by a computer, such as a client or a server, and functions as a plurality of processing units. Second, there is an aspect where a processor implementing the functions of the entire system, which includes a plurality of processing units, by one integrated circuit (IC) chip is used as typified by System On Chip (SoC) or the like. In this way, various processing units are formed using one or more of the above-mentioned various processors as hardware structures.

In addition, the hardware structures of these various processors are more specifically electrical circuitry where circuit elements, such as semiconductor elements, are combined.

Further, it goes without saying that the invention is not limited to the above-mentioned embodiments and has various modifications without departing from the scope of the invention.

EXPLANATION OF REFERENCES

10: imaging device
20: finder window
22: shutter release switch
23: shutter speed dial
24: exposure correction dial
25: power lever
26: eyepiece part
27: MENU/OK key
28: cross key
29: play button
30: built-in flash
100, 300: interchangeable lens
102, 302: imaging optical system
104, 304: lens group
108, 308: stop
160, 360: lens mount
200: camera body
201: image sensor
202: image sensor control unit
203: analog signal processing unit
204: A/D converter
205: image input controller
206: digital signal processing unit
207: RAM
208: compression/decompression processing unit
209: focus adjustment unit
210: media control unit
212: memory card
214: display control unit
216: monitor
220: body-side CPU
220A: sensor driver (sensor drive section)
220B: focal area information-acquisition section
220C: phase difference pixel information-acquisition section
220D, 220D-1, 220D-2, 220D-3: information acquisition section
221A: first phase shift distance-detection section
221B: first arithmetic operation section
221C: second arithmetic operation section
221D: conversion section
221E: reading section
222: operation unit
224: clock unit
226: flash ROM
228: ROM
230: AF control unit
230A: phase shift distance-detection section
230B: defocus distance-calculation section
232: brightness detection unit
234: white balance correction unit
236: wireless communication unit
238: GPS receiver
240: power control unit
242: battery
244: lens power switch
250: body-side communication unit
260: body mount
270: flash light-emitting unit
272: flash control unit 296: FPS control unit
316: focus lens control unit
318: stop control unit
320: lens-side CPU
322: RAM
324: ROM
326: flash ROM
350: lens-side communication unit
D: aperture diameter
Gc, PAc, PBc: sensitivity
L: optical axis
MA, MB: light blocking film
ML: microlens
NA: numerical aperture
P1: first position
P2: second position
PA: first phase difference pixel
PB: second phase difference pixel
PD: photodiode
S10 to S24: Step
Y: luminance data
d1: first phase shift distance
d2: second phase shift distance
f: focal length
r: radius
z: defined distance
θ: ray angle

What is claimed is:

1. An imaging device comprising:
an image sensor that includes a first phase difference pixel and a second phase difference pixel having incidence angle characteristics different from incidence angle characteristics of the first phase difference pixel;
a mount part to and from which an interchangeable lens is attachable and detachable;
a sensor driver that moves the image sensor in a direction of an optical axis of the interchangeable lens mounted on the mount part and moves the image sensor to a first position and a second position; and
a processor configured to:
acquire outputs of the first and second phase difference pixels of the image sensor in a case where the image sensor is moved to the first position by the sensor driver and acquires outputs of the first and second phase difference pixels of the image sensor in a case where the image sensor is moved to the second position; and
acquire information related to a ray angle with respect to the image sensor in a case where subject light is incident on the image sensor through the interchangeable lens on the basis of the outputs of the first and second phase difference pixels at the first and second positions.

2. The imaging device according to claim 1, wherein the sensor driver moves the image sensor to a position, to which the image sensor is moved from the first position by a defined distance in a direction toward a focusing position where a subject is in focus, as the second position from the first position.

3. The imaging device according to claim 1, wherein the processor is further configured to acquire focal area information representing a focus adjustment area in an entire area of the image sensor.

4. The imaging device according to claim 3, wherein the processor is further configured to acquire a preset focus adjustment area, an area where a main subject is present, or an area having high contrast in the entire area of the image sensor, as the focal area information representing the focus adjustment area.

5. The imaging device according to claim 3, wherein the sensor driver moves the image sensor to a position to which the image sensor is moved from the first position by a defined distance in a direction toward a focusing position where a subject present in the focus adjustment area is in focus, as the second position, in a case where a position where a phase difference is capable of being detected on the basis of outputs of the first and second phase difference pixels corresponding to the acquired focus adjustment area is defined as the first position.

6. The imaging device according to claim 1, wherein the information related to a ray angle with respect to the image sensor is a ray angle with respect to the image sensor, a stop value of the interchangeable lens, or a numerical aperture of the interchangeable lens.

7. The imaging device according to claim 1, wherein the processor is further configured to:
detect a first phase shift distance at the first position and a second phase shift distance at the second position on the basis of the outputs of the first and second phase difference pixels of the image sensor,
calculate a difference between the first phase shift distance at the first position and the second phase shift distance at the second position calculate a ray angle with respect to the image sensor on the basis of the calculated difference and a moving distance between the first and second positions where the image sensor is moved, and
acquire the ray angle as the information related to a ray angle with respect to the image sensor.

8. The imaging device according to claim 7, wherein the processor is further configured to calculate an angle, which is smaller than the ray angle and is defined by the first and second phase shift distances on the basis of the calculated difference and the moving distance between the first and second positions where the image sensor is moved, and calculate the ray angle by multiplying the calculated angle and a correction coefficient together.

9. The imaging device according to claim 7, wherein the processor is further configured to:
convert the ray angle into a stop value or a numerical aperture, and
acquire the stop value or the numerical aperture, as the information related to a ray angle with respect to the image sensor.

10. The imaging device according to claim 1, further comprising:
a storage in which a relationship between a difference between a first phase shift distance at the first position and a second phase shift distance at the second position and a stop value or a numerical aperture of the interchangeable lens is stored for each stop value or each numerical aperture of the interchangeable lens,
wherein the processor is further configured to:
detect the first phase shift distance at the first position and the second phase shift distance at the second position on the basis of the outputs of the first and second phase difference pixels of the image sensor,
calculate a difference between the first phase shift distance at the first position and the second phase shift distance at the second position, and read a stop value or a numerical aperture corresponding to the difference from the storage on the basis of the difference, and acquire the stop value or the numerical aperture, as the information related to a ray angle with respect to the image sensor.

11. The imaging device according to claim 1, wherein the processor is further configured to:
communicate with the interchangeable lens; and
cause the sensor driver to operate in a case where the stop value of the interchangeable lens is not capable of being acquired from the mounted interchangeable lens.

12. The imaging device according to claim 11, wherein the processor is further configured to calculate brightness of a subject using a stop value or a numerical aperture of the interchangeable lens or a stop value or a numerical aperture of the interchangeable lens.

13. The imaging device according to claim 1, wherein the processor is further configured to:
detect a phase shift distance on the basis of the outputs of the first and second phase difference pixels of the image sensor;
calculate a defocus distance on the basis of the information related to a ray angle with respect to the image sensor and the phase shift distance; and
move the image sensor on the basis of the calculated defocus distance.

14. The imaging device according to claim 1, wherein the processor is further configured to:
set an information acquisition mode,
wherein the sensor driver, operates in a case where an imaging instruction is input in a state where the information acquisition mode is set.

15. The imaging device according to claim 1, wherein the processor is further configured to:
acquire image data through the image sensor in a case where an imaging command is input
create an image file storing the acquired image data and records the image file in a recording medium; and
record the information related to a ray angle with respect to the image sensor, in a header of the image file.

16. The imaging device according to claim 1, wherein the sensor driver moves the image sensor to three or more positions including the first and second positions,
wherein the processor is further configured to acquire outputs of the first and second phase difference pixels of the image sensor in a case where the image sensor is moved to each of the three or more positions, and acquire information related to a ray angle with respect to the image sensor in a case where subject light is incident on the image sensor through the interchangeable lens on the basis of the outputs of the first and second phase difference pixels at each of the three or more positions.

17. An information acquisition method for an imaging device comprising an image sensor that includes a first phase difference pixel and a second phase difference pixel provided thereon, the second phase difference pixel having incidence angle characteristics different from incidence angle characteristics of the first phase difference pixel, the information acquisition method comprising:
a step of acquiring outputs of the first and second phase difference pixels from the image sensor in a case where the image sensor is positioned at a first position in a direction of an optical axis of an interchangeable lens mounted on the imaging device;
a step of moving the image sensor from the first position to a second position in the direction of the optical axis of the interchangeable lens by a sensor driver;
a step of acquiring outputs of the first and second phase difference pixels from the image sensor in a case where the image sensor is positioned at the second position; and
a step of acquiring information related to a ray angle with respect to the image sensor in a case where subject light is incident on the image sensor through the interchangeable lens on the basis of the outputs of the first and second phase difference pixels at the first and second positions.

18. The information acquisition method according to claim 17,
wherein in the step of moving the image sensor, the image sensor is moved to a position, to which the image sensor is moved from the first position by a defined distance in a direction toward a focusing position where a subject is in focus, as the second position from the first position.

19. The information acquisition method according to claim 17,
wherein the information related to a ray angle with respect to the image sensor is a ray angle with respect to the image sensor, a stop value of the interchangeable lens, or a numerical aperture of the interchangeable lens.

20. The information acquisition method according to claim 17,
wherein the step of acquiring information related to a ray angle with respect to the image sensor includes
a step of detecting a first phase shift distance at the first position and a second phase shift distance at the second position on the basis of the outputs of the first and second phase difference pixels of the image sensor,
a step of calculating a difference between the detected first phase shift distance at the first position and the detected second phase shift distance at the second position, and
a step of calculating a ray angle with respect to the image sensor on the basis of the calculated difference and a moving distance between the first and second positions where the image sensor is moved, and
the calculated ray angle is acquired as the information related to a ray angle with respect to the image sensor in the step of acquiring information related to a ray angle with respect to the image sensor.

21. The information acquisition method according to claim 17,
wherein the imaging device comprises a storage in which a relationship between a difference between a first phase shift distance at the first position and a second phase shift distance at the second position and a stop value or a numerical aperture of the interchangeable lens is stored for each stop value or each numerical aperture of the interchangeable lens,
the step of acquiring information related to a ray angle with respect to the image sensor includes
a step of detecting the first phase shift distance at the first position and the second phase shift distance at the second position on the basis of the outputs of the first and second phase difference pixels of the image sensor, a step of calculating a difference between the detected first phase shift distance at the first position and the detected second phase shift distance at the second position, and a step of reading a stop value or a numerical aperture corresponding to the difference from the storage on the basis of the calculated difference, and the read stop value or the read numerical aperture is acquired as the information related to a ray angle with respect to the image sensor in the step of acquiring information related to a ray angle with respect to the image sensor.

22. A non-transitory computer-readable recording medium causing a computer to implement an information acquisition function of an imaging device in a case where a command stored in the recording medium is read by the computer, the imaging device comprising an image sensor that includes a first phase difference pixel and a second phase difference pixel provided thereon, the second phase difference pixel having incidence angle characteristics different from incidence angle characteristics of the first phase difference pixel, the information acquisition function comprising:

a function of acquiring outputs of the first and second phase difference pixels from the image sensor in a case where the image sensor is positioned at a first position in a direction of an optical axis of an interchangeable lens mounted on the imaging device;

a function of moving the image sensor from the first position to a second position in the direction of the optical axis of the interchangeable lens by a sensor driver;

a function of acquiring outputs of the first and second phase difference pixels from the image sensor in a case where the image sensor is positioned at the second position; and a function of acquiring information related to a ray angle with respect to the image sensor in a case where subject light is incident on the image sensor through the interchangeable lens on the basis of the outputs of the first and second phase difference pixels at the first and second positions.

* * * * *